(12) United States Patent
Suzuki et al.

(10) Patent No.: US 12,439,607 B2
(45) Date of Patent: Oct. 7, 2025

(54) INSPECTION DEVICE

(71) Applicant: SAMSUNG ELECTRONICS CO., LTD., Suwon-si (KR)

(72) Inventors: Kenji Suzuki, Yokohama (JP); Ingi Kim, Suwon-si (KR); Mitsunori Numata, Yokohama (JP); Shinji Ueyama, Yokohama (JP); Tomoki Onishi, Yokohama (JP)

(73) Assignee: Samsung Electronics Co., Ltd., Suwon-si (KR)

( * ) Notice: Subject to any disclaimer, the term of this patent is extended or adjusted under 35 U.S.C. 154(b) by 143 days.

(21) Appl. No.: 18/533,528

(22) Filed: Dec. 8, 2023

(65) Prior Publication Data

US 2024/0201104 A1 Jun. 20, 2024

(30) Foreign Application Priority Data

Dec. 16, 2022 (JP) ................................ 2022-200858
Mar. 10, 2023 (KR) ........................ 10-2023-0031569

(51) Int. Cl.
*G01R 33/02* (2006.01)
*G01R 13/40* (2006.01)
(Continued)

(52) U.S. Cl.
CPC ............. *H10B 61/00* (2023.02); *G01R 13/40* (2013.01); *G01R 31/302* (2013.01);
(Continued)

(58) Field of Classification Search
CPC ............ G01R 33/0005; G01R 33/0325; G01R 31/302; G01R 13/40; H01E 7/06; H10B 61/00; H01F 2007/062
See application file for complete search history.

(56) References Cited

U.S. PATENT DOCUMENTS

2012/0092972 A1* 4/2012 Taratorin ............. G01R 33/032
369/13.29
2019/0027291 A1 1/2019 Joumard et al.
(Continued)

FOREIGN PATENT DOCUMENTS

JP 2003-069111 A 3/2003
JP 2014-501143 A 1/2014
(Continued)

*Primary Examiner* — Thang X Le
(74) *Attorney, Agent, or Firm* — Fish & Richardson P.C.

(57) ABSTRACT

An inspection device improves accuracy characteristics of an (MRAM), the inspection device including a stage on which a MRAM element is fixed, and electromagnets generating a first magnetic field. A magnetic field having a component in a direction perpendicular to the stage is changeable from a first direction to a second direction according to a position on the stage. A second magnetic field in which a direction of a magnetic field component is parallel to the stage changes from a third direction to a fourth direction according to the position on the stage, an optical system illuminating the MRAM element with light including polarized light, and condensing reflected light from reflected illumination light from the MRAM element, and a detector detecting reflected light when the position of the MRAM element is changed, and when the position of the MRAM element in the second magnetic field is changed.

20 Claims, 19 Drawing Sheets

(51) Int. Cl.
  *G01R 31/302* (2006.01)
  *G01R 33/00* (2006.01)
  *G01R 33/032* (2006.01)
  *H01F 7/06* (2006.01)
  *H10B 61/00* (2023.01)

(52) U.S. Cl.
  CPC ..... *G01R 33/0005* (2013.01); *G01R 33/0325* (2013.01); *H01F 7/06* (2013.01); *H01F 2007/062* (2013.01)

(56) References Cited

U.S. PATENT DOCUMENTS

| | | | |
|---|---|---|---|
| 2020/0126873 A1* | 4/2020 | Noh | H01F 10/3286 |
| 2021/0025951 A1 | 1/2021 | Vajda | |
| 2022/0050138 A1* | 2/2022 | Watanabe | H01L 22/00 |
| 2022/0137160 A1* | 5/2022 | Sekiya | G01R 33/1207 |
| | | | 324/244.1 |

FOREIGN PATENT DOCUMENTS

| | | |
|---|---|---|
| JP | 2016-219432 A | 12/2016 |
| JP | 2017-536187 A | 12/2017 |
| JP | 6282754 B2 | 2/2018 |
| JP | 2019-504498 A | 2/2019 |
| JP | 6560415 B2 | 7/2019 |
| JP | 2020-036885 A | 3/2020 |
| JP | 2020-061523 A | 4/2020 |
| JP | 2021-508524 A | 3/2021 |
| JP | 2021-508525 A | 3/2021 |
| JP | 2021-508557 A | 3/2021 |
| JP | 2021-509046 A | 3/2021 |
| JP | 2021-509319 A | 3/2021 |
| JP | 2021-509599 A | 4/2021 |
| JP | 2021-509604 A | 4/2021 |
| JP | 2021-510555 A | 4/2021 |
| JP | 2021-128955 A | 9/2021 |
| JP | 2022-072599 A | 5/2022 |
| JP | 2022-534419 A | 7/2022 |

* cited by examiner

INSPECTION DEVICE

CROSS-REFERENCE TO RELATED APPLICATION(S)

This application claims benefit of priority to Japanese Patent Application No. 2022-200858 filed on Dec. 16, 2022 in the Japan Patent Office, and Korean Patent Application No. 10-2023-0031569 filed on Mar. 10, 2023 in the Korean Intellectual Property Office, the disclosures of which are incorporated herein by reference in their entireties.

BACKGROUND

1 Field

Embodiments relate to an inspection device, for example, to an inspection device for inspecting magnetic characteristics of a magnetoresistive random access memory (MRAM) device.

2. Description of the Related Art

A semiconductor memory device known as a MRAM device may be a non-volatile memory that includes a magnetic tunnel junction (MTJ) as a component. In a semiconductor production line, early inspection of an MRAM device formed on a wafer to detect abnormalities before completion of the MRAM device may be important for improving the yield of production of the MRAM device. In order to inspect the MRAM device prior to the completion, it is desirable to determine magnetic field characteristics as well as to conduct non-destructive external inspections using an optical microscope, an electron beam, or the like. To provide a high-speed measurement means for measuring a magnetic field, an optical measurement technique using a magneto-optical effect called a magneto-optical Kerr effect (MOKE) has been known. According to the optical measurement technique, an external magnetic field may be applied to each MRAM element in the MRAM device. A magnetic hysteresis loop at a measurement point may be acquired by changing the amount of polarized light in reflected light while changing a magnetic field strength thereof.

SUMMARY

According to embodiments, an inspection device may include: a stage having a stage surface and a MRAM element fixed on the stage surface; a plurality of electromagnets generating a first magnetic field in which a direction of a magnetic field component in a vertical direction, perpendicular to the stage surface, changes from a first direction to a second direction, opposite to the first direction, according to a position on the stage surface, and a second magnetic field in which a direction of a magnetic field component in an in-plane direction, parallel to the stage surface, changes from a third direction to a fourth direction, opposite to the third direction, according to the position on the stage surface; an optical system illuminating the MRAM element with illumination light including polarized light, and simultaneously condensing reflected light from which the illumination light is reflected from the MRAM element; and a detector detecting the reflected light when the position of the MRAM element in the first magnetic field is changed, and the reflected light when the position of the MRAM element in the second magnetic field is changed.

In the inspection device, when the position of the MRAM element is altered to change from the first direction to the second direction in the first magnetic field, a magnetic field component in a direction that is perpendicular to a first scan direction from the first direction to the second direction and perpendicular to the vertical direction, may be 0.

In the inspection device, when the position of the MRAM element is altered to change from the third direction to the fourth direction in the second magnetic field, a magnetic field component in a second scan direction from the third direction to the fourth direction and the magnetic field component in the vertical direction may be 0.

In the inspection device, the plurality of electromagnets may include at least four electromagnets including a first electromagnet, a second electromagnet, a third electromagnet, and a fourth electromagnet. The first electromagnet may include a first coil that is wound in a predetermined direction on a first vertical portion of a first yoke having an L-shape. The first yoke may have a first vertical portion extending in the vertical direction and a first in-plane portion extending in the in-plane direction. The second electromagnet may include a second coil that is wound in the predetermined direction on a second vertical portion of a second yoke having an L-shape. The second yoke may include the second vertical portion extending in the vertical direction and a second in-plane portion extending in the in-plane direction. The third electromagnet may include a third coil wound in the predetermined direction on a third vertical portion of a third yoke having an L-shape. The third yoke may include the third vertical portion extending in the vertical direction and a third in-plane portion extending in the in-plane direction. The fourth electromagnet may include a fourth coil wound in the predetermined direction on a fourth vertical portion of a fourth yoke having an L-shape. The fourth yoke may have the fourth vertical portion extending in the vertical direction and a fourth in-plane portion extending in the in-plane direction. The first in-plane portion and the second in-plane portion may extend in one direction, and an end portion of the first in-plane portion and the end portion of the second in-plane portion may be opposed in the one direction. The third in-plane portion and the fourth in-plane portion may extend in the other direction, orthogonal to the one direction, and the end portion of the third in-plane portion and the end portion of the fourth in-plane portion may oppose in the one direction. The first magnetic field may be generated by flowing a current in a fifth direction through the first coil, flowing the current in a sixth direction, opposite to the fifth direction, through the second coil, and setting the current flowing in the third coil and the fourth coil to be 0. The second magnetic field may be generated by flowing the current in the fifth direction through the first coil and the second coil, and simultaneously flowing the current in the sixth direction through the third coil and the fourth coil.

In the inspection device, the detector may detect reflected light when the position of the MRAM element in the first magnetic field is scanned in the one direction, and may detect the reflected light when the position of the MRAM element in the second magnetic field is scanned in a direction of 45° with regard to the one direction and the other direction.

The inspection device may further include an information processing unit that processes an image of the reflected light detected by the detector. The information processing unit may perform inspection of a defect in the MRAM element by the magnetic field component in the vertical direction by detecting a differing image between the image in a magnetic field component in the first direction and the image in a magnetic field component in the second direction.

The inspection device may further include an information processing unit that processes an image of the reflected light detected by the detector. The information processing unit may perform an inspection of a defect in the MRAM element by the magnetic field component in the in-plane direction, from a differing image between the image in a magnetic field component in the third direction and the image in a magnetic field component in the fourth direction.

According to embodiments, an inspection device may include: a stage having a stage surface and fixing a MRAM element on the stage surface; a first electromagnet, a second electromagnet, a third electromagnet and a fourth electromagnet each includes a yoke whose end faces a predetermined area and a coil wound around yoke in the same direction, wherein an end of a yoke of the first electromagnet and an end of a yoke of the second electromagnet are oppose in an one direction, and an end of a yoke of the third electromagnet and an end of a yoke of the fourth electromagnet are oppose in a direction orthogonal to the one direction; an optical system illuminating the MRAM element with illumination light including polarized light, and simultaneously condensing reflected light from which the illumination light is reflected from the MRAM element; and a detector detecting the reflected light when the position of the MRAM element in magnetic fields generated in the predetermined area is changed.

According to embodiments, an inspection device may include: a stage having a stage surface and fixing a MRAM element on the stage surface; a first electromagnet, a second electromagnet, a third electromagnet and a fourth electromagnet each includes a yoke whose end faces a predetermined area and a coil wound around yoke in the same direction, wherein an end of a yoke of the first electromagnet and an end of a yoke of the second electromagnet are oppose in an one direction, an end of a yoke of the third electromagnet and an end of a yoke of the fourth electromagnet are oppose in a direction orthogonal to the one direction and the first to fourth electromagnetic generate a first magnetic field in the predetermined space by applying currents in opposite direction to coils of the first and the second electromagnet and not applying currents to coils of the third and the fourth electromagnet; an optical system illuminating the MRAM element with illumination light including polarized light, and simultaneously condensing reflected light from which the illumination light is reflected from the MRAM element; a detector detecting the reflected light when the position of the MRAM element in the first magnetic field is changed; and an information processing unit performing an inspection a detect in the MRAM element by the magnetic field component in a vertical direction perpendicular to the stage surface based on images generated when the position of the MRAM element in the first magnetic field is changed.

BRIEF DESCRIPTION OF DRAWINGS

Features will become apparent to those of skill in the art by describing in detail exemplary embodiments with reference to the attached drawings in which.

DETAILED DESCRIPTION

Figure 1:
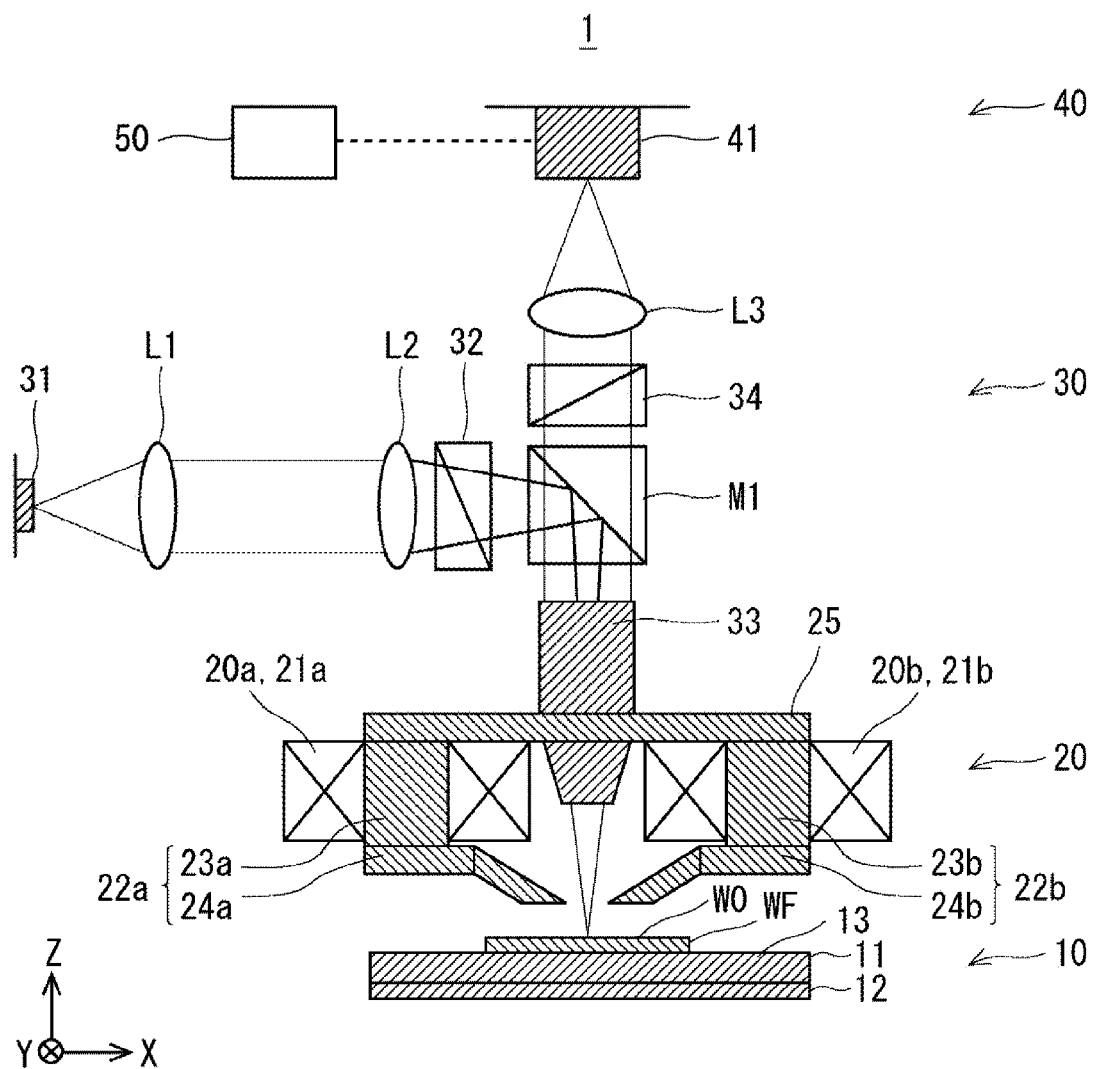
FIG. 1 is a cross-sectional view illustrating an inspection device according to a first embodiment.

For clarity of explanation, the following description and drawings may be appropriately omitted and/or simplified. In each of the drawings, the same reference numerals may be used to denote the same components, and overlapping descriptions will not be repeated, unless necessary.

First Embodiment

Figure 2:
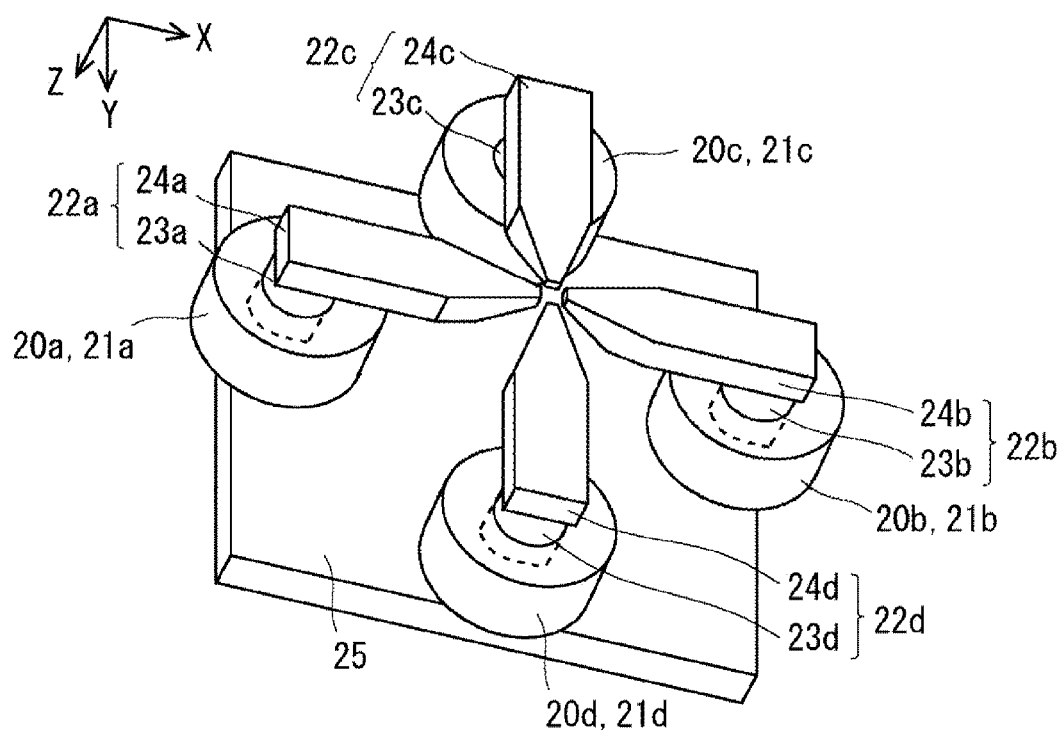
FIG. 2 is a perspective view illustrating an electromagnet of an inspection device according to the first embodiment.

An inspection device according to a first embodiment will be described. FIG. 1 is a cross-sectional view illustrating an inspection device according to a first embodiment. FIG. 2 is a perspective view illustrating an electromagnet of an inspection device according to a first embodiment. In FIG. 1, in order to prevent complicated drawings, hatching of several members will be omitted, and several signs will be simultaneously omitted. Simplification may be applied to the following drawings in a similar manner as described above. As illustrated in FIGS. 1 and 2, an inspection device 1 may include a stage 10, a plurality of electromagnets 20, an optical system 30, a detector 40, and an information processing unit 50. Hereinafter, components of and terms used in the inspection device and operations using the inspection device including the following: <1. Stage >, <2. Plurality of Electromagnets >, <3. Optical System >, <4. Detector >, <5. Information Processing Unit >. <6. Details of Inspection Device > and <7. Inspection Method> will be explained. In addition, <2. Plurality of Electromagnets >, <2-1. Magnetic Characteristics of MRAM Element >, <2-2. Applying Magnetic Field in a direction, perpendicular to Stage Surface > and <2-3. Applying Magnetic Field in a direction, parallel to Stage Surface> will be explained.

<1. Stage >

The stage 10 may include a moving portion 11 and a main body portion 12. An upper surface of the moving portion 11 may be referred to as a stage surface 13. The stage 10 may include the stage surface 13. A magnetoresistive random access memory element (hereinafter referred to as an MRAM element) may be fixed onto the stage surface 13 of the stage 10. For example, in the stage 10, a sample such as a wafer WF or the like, including the MRAM element, may be placed on the stage surface 13. Hereinafter, the sample will be described as the wafer WF. The sample is not limited to being a wafer WF, as long as the sample includes the MRAM element and is a semiconductor device or the like.

The moving portion 11 in the stage 10 may include a wafer chuck for fixing the wafer WF. The wafer WF may be held on the stage surface 13 by vacuum or static electricity using the wafer chuck. The stage 10 may have an XYZθ drive shaft including an actuator such as a linear motor, a ball screw, a voice coil motor (VCM), a piezo device, or the like, to move the wafer WF. The moving portion 11 may move with respect to the main body portion 12, based on the XYZθ drive shaft. An inspection surface W0 may be provided as a surface parallel to the stage surface 13.

In this case, for convenience of description of the inspection device 1, an XYZ Cartesian coordinate axis system may be introduced. For example, a direction that is perpendicular to the inspection surface W0, may be a Z-axis direction, and a plane that is parallel to the inspection surface W0, may be an X-Y plane. For convenience, the Z-axis direction may be referred to as a gravity direction or a vertical direction, a +Z-axis direction may be referred to as an upward direction, and a −Z-axis direction may be referred to as a downward direction. The X-Y plane may be referred to as a horizontal plane. A direction parallel to the X-Y plane may be referred to as a horizontal direction or an in-plane direction. The gravity direction, the vertical direction, the upward direction, the downward direction, the horizontal plane, the horizontal direction, and the in-plane direction are illustrative for convenience, and may not indicate directions in which the inspection device 1 is actually disposed. The stage 10 may be scanned on the X-Y plane in a predetermined direction to inspect the MRAM element included in the wafer WF.

The stage 10 may move the wafer WF in a predetermined direction including an X-axis direction and a Y-axis direction in a plane, parallel to the inspection surface W0. In addition, the stage 10 may rotate the wafer WF on the stage surface 13 around a rotation axis extending in a direction perpendicular to the inspection surface W0. Furthermore, the stage 10 may move the wafer WF on the stage surface 13 in a direction, perpendicular to the inspection surface W0.

<2. Plurality of Electromagnets >

The plurality of electromagnets 20 may include at least four electromagnets 20a to 20d including electromagnets 20a to 20d. The at least four electromagnets 20a to 20d may be collectively referred to as the electromagnet 20. The individual electromagnets 20a and the electromagnet 20b may be disposed to oppose each other in the X-axis direction. The electromagnets 20c and the electromagnet 20d may be disposed to oppose each other in the Y-axis direction. The number of electromagnets 20 may be five or more as long as at least four electromagnets, for example, 20a to 20d, are included. In that case, the electromagnets 20 are not limited to an arrangement to oppose each other in the X-axis direction and in the Y-axis direction.

The electromagnets 20a to 20d may include coils 21a to 21d, respectively. The coils 21a to 21d may be collectively referred to as a coil 21. A direction of a current flowing through the coil 21 may be controlled to control a direction of a magnetic field generated by the electromagnet 20.

The electromagnets 20a to 20d may be fixed to yokes 22a to 22d, respectively. The yokes 22a to 22d may be collectively referred to as a yoke 22. The yoke 22 may have, for example, an L-shape. The yoke 22 having an L-shape may have a vertical portion 23 extending in a direction that is perpendicular to the stage surface 13. An in-plane portion 24 may extend in a direction parallel to the stage surface 13. The coil 21 may be wound around the vertical portion 23 in a predetermined direction.

Specifically, the electromagnet 20a may include the coil 21a wound in a predetermined direction around a vertical portion 23a of the yoke 22a having an L-shape and having the vertical portion 23a extending in a direction perpendicular to the stage surface 13. An in-plane portion 24a may extend in a direction parallel to the stage surface 13. The electromagnet 20b may include the coil 21b wound in a predetermined direction around a vertical portion 23b of the yoke 22b having an L-shape and having the vertical portion 23b extending in a direction, perpendicular to the stage surface 13. An in-plane portion 24b may extend in a direction parallel to the stage surface 13. The electromagnet 20c may include the coil 21c wound in a predetermined direction around a vertical portion 23c of the yoke 22c having an L-shape. The vertical portion 23c of the yoke 22c may extend in a direction perpendicular to the stage surface 13. An in-plane portion 24c may extend in a direction, parallel to the stage surface 13. The electromagnet 20d may include the coil 21d wound in a predetermined direction around a vertical portion 23d of the yoke 22d having an L-shape. The electromagnet 20d may include a vertical portion 23d extending in a direction perpendicular to the stage surface 13 and the electromagnet 20d may include an in-plane portion 24d extending in a direction, parallel to the stage surface 13.

The vertical portions 23a to 23d may be collectively referred to as the vertical portion 23. The in-plane portions

24*a* to 24*d* may be collectively referred to as the in-plane portion 24. The coils 21*a* to 21*d* may be wound in the same predetermined direction around the vertical portions 23*a* to 23*d*, respectively. The vertical portions 23*a* to 23*d* may extend in the Z-axis direction. The vertical portions 23*a* to 23*d* may pass through central axes of the electromagnets 20*a* to 20*d*, respectively. An upper end of each of the yokes 22*a* to 22*d*, e.g., an upper end of each of the vertical portions 23*a* to 23*d* may be connected to a connection plate 25. Lower ends of the vertical portions 23*a* to 23*d* may be connected to one ends of the in-plane portions 24*a* to 24*d*, respectively.

The in-plane portion 24*a* of the yoke 22*a* and the in-plane portion 24*b* of the yoke 22*b* may extend in the X-axis direction. The one end of the in-plane portion 24*a* may be connected to a lower end of the vertical portion 23*a* passing through a center of the electromagnet 20*a*. Therefore, the in-plane portion 24*a* may extend from the lower end of the vertical portion 23*a* in the +X-axis direction. The one end of the in-plane portion 24*b* may be connected to a lower end of the vertical portion 23*b* passing through a center of the electromagnet 20*b*. Therefore, the in-plane portion 24*b* may extend from the lower end of the vertical portion 23*b* in the −X-axis direction. An end portion of the in-plane portion 24*a* and an end portion of the in-plane portion 24*b* may oppose each other in the X-axis direction.

The in-plane portion 24*c* of the yoke 22*c* and the in-plane portion 24*d* of the yoke 22*d* may extend in the Y-axis direction. The one end of the in-plane portion 24*c* may be connected to a lower end of the vertical portion 23*c* passing through a center of the electromagnet 20*c*. Therefore, the in-plane portion 24*c* may extend from the lower end of the vertical portion 23*c* in the +Y axis direction. The one end of the in-plane portion 24*d* may be connected to a lower end of the vertical portion 23*d* passing through a center of the electromagnet 20*d*. Therefore, the in-plane portion 24*d* may extend from the lower end of the vertical portion 23*d* in the −Y axis direction. An end portion of the in-plane portion 24*c* and an end portion of the in-plane portion 24*d* may oppose in the Y-axis direction.

<2-1. Magnetic Characteristics of MRAM Element >

Figure 3:
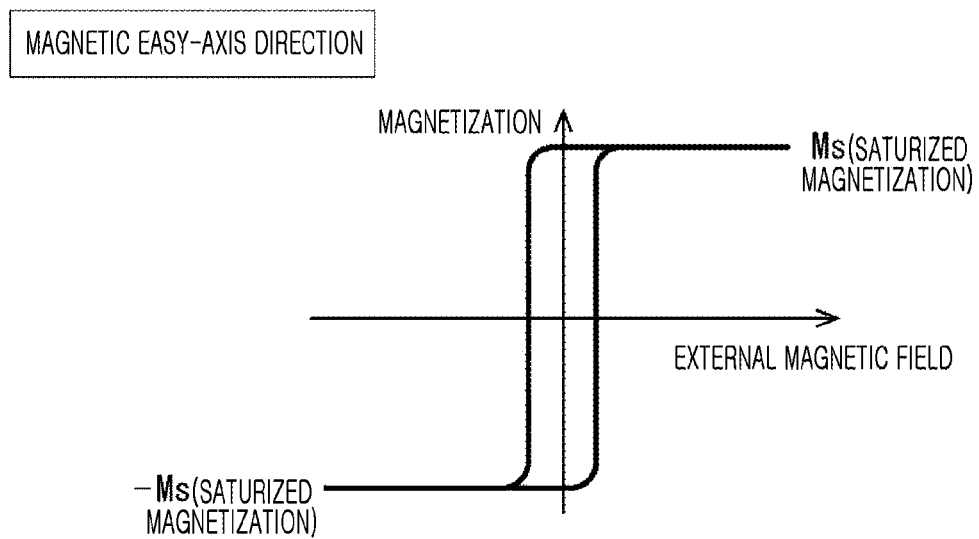
FIG. 3 is a graph illustrating magnetic characteristics of an MRAM element in a magnetic easy-axis direction obtained by a vibrating sample magnetometer (VSM) according to a first embodiment, in which a horizontal axis represents an external magnetic field and a vertical axis represents magnetization.
Figure 4:
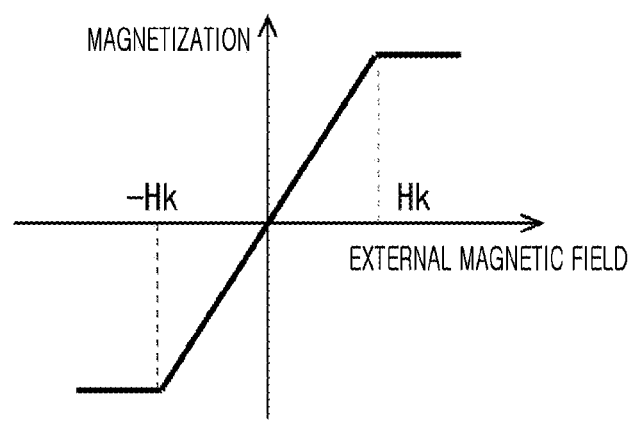
FIG. 4 is a graph illustrating magnetic characteristics of an MRAM element obtained in a magnetic hard-axis direction by a VSM according to a first embodiment, in which a horizontal axis represents an external magnetic field and a vertical axis represents magnetization.

Next, magnetic characteristics of a vibrating sample magnetometer (VSM) of the MRAM will be described. FIG. 3 is a graph illustrating magnetic characteristics of an MRAM element in a magnetic easy-axis direction by a vibrating sample magnetometer (VSM) according to a first embodiment. In FIG. 3, a horizontal axis represents an external magnetic field and a vertical axis represents magnetization. FIG. 4 is a graph illustrating magnetic characteristics of an MRAM element in a magnetic hard-axis direction by a VSM according to a first embodiment, in which a horizontal axis represents an external magnetic field and a vertical axis represents magnetization.

As illustrated in FIG. 3, an MRAM element can easily be magnetically-switched in a direction perpendicular to an upper surface of a wafer WF by changing an external magnetic field. The direction perpendicular to the upper surface of the wafer WF, e.g., a direction, perpendicular to a stage surface 13 may be referred to as a magnetic easy-axis direction. As illustrated in FIG. 4, it may be difficult to magnetically switch an MRAM element in a direction parallel to an upper surface of a wafer WF by changing an external magnetic field. The direction parallel to the upper surface of the wafer WF, e.g., a direction, parallel to a stage surface 13 may be referred to as a magnetic hard-axis direction. In this manner, magnetic characteristics in the magnetic easy-axis direction, which is perpendicular to the upper surface of the wafer WF, may be different from magnetic characteristics in the magnetic hard-axis direction, which is parallel to the upper surface of the wafer WF. For this reason, it is necessary to inspect magnetic characteristics both directions, the magnetic easy-axis direction and the magnetic hard-axis direction in order to detect a defect in the MRAM element.

<2-2. Applying Magnetic Field in a Direction, Perpendicular to Stage Surface >

Figure 5:
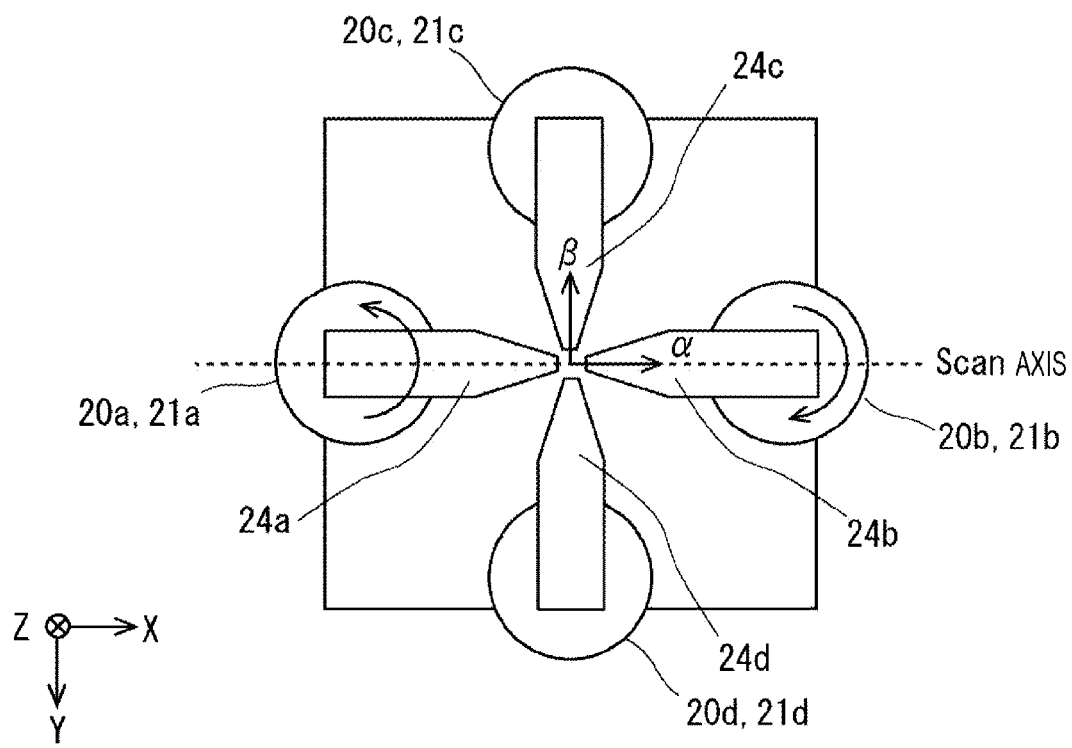
FIG. 5 is a view illustrating a direction of a current applied to a coil for applying a magnetic field having a magnetic field component in a direction that is perpendicular to a stage surface, to an MRAM element, according to a first embodiment.

FIG. 5 is a view illustrating a direction of a current applied to a coil 21 for applying a magnetic field having a magnetic field component in a direction perpendicular to a stage surface 13, to an MRAM element, according to a first embodiment. As illustrated in FIG. 5, in order to apply a magnetic field having a magnetic field component in a direction perpendicular to a stage surface 13 to an MRAM element, currents in opposite directions may be applied to coils 21*a* and 21*b* of electromagnets 20*a* and 20*b* opposing each other in the X-axis direction. No current may be applied to coils 21*c* and 21*d* of electromagnets 20*c* and 20*d* opposing each other in the Y-axis direction.

For example, the magnetic field having the magnetic field component in the direction perpendicular to the stage surface 13 may be generated by flowing a current in the coil 21*a* in a predetermined direction, flowing a current in the coil 21*b* in a direction opposite to the predetermined direction, and setting the currents flowing through the coils 21*c* and 21*d* to be zero (0). The magnetic field having the magnetic field component in the direction perpendicular to the stage surface 13 may be referred to as a first magnetic field. Further, the direction perpendicular to the stage surface 13 may be referred to as a vertical direction. In the first magnetic field, an α-axis direction that is parallel to the X-axis direction may be taken as a scan axis. The scan axis in the first magnetic field may be referred to as a first scan axis. A direction orthogonal to the α-axis direction in an X-Y plane may be referred to as a β-axis direction. A β-axis may be in the same direction as a Y-axis. A direction orthogonal to the α-axis direction and the β-axis direction may be referred to as a γ-axis. The γ-axis may be in the same direction as a Z-axis. The β axis and the γ axis may be perpendicular to the first scan axis.

Figure 6:
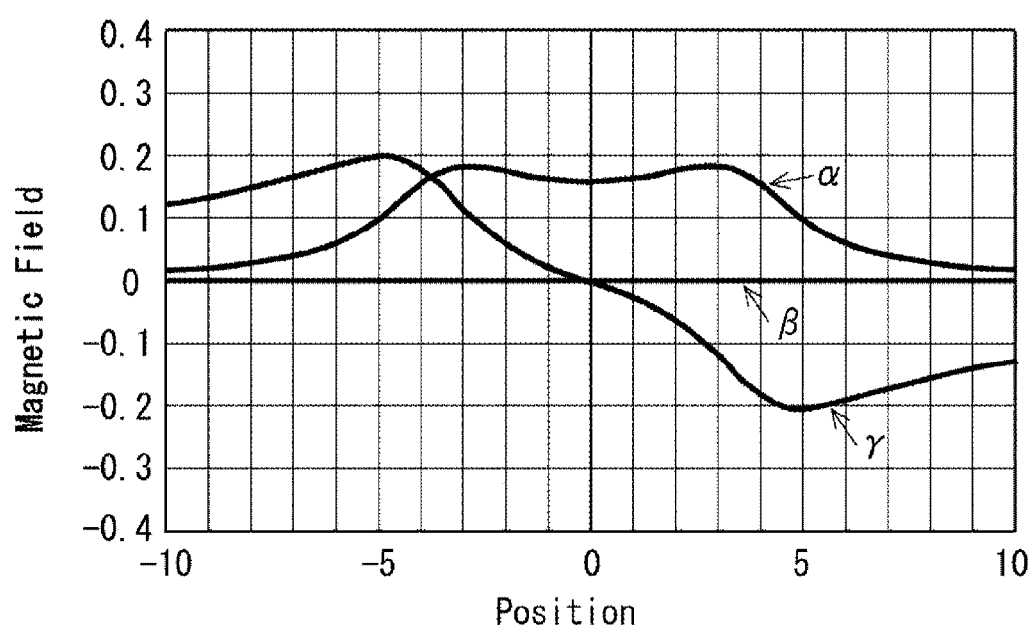
FIG. 6 is a graph illustrating magnetic flux densities in an α-axis direction along a first scan axis, and magnetic flux densities in a β-axis direction and a γ-axis direction, perpendicular to the first scan axis, according to a first embodiment, in which a horizontal axis represents a position along an α axis and a vertical axis represents magnetic flux density.
Figure 7:
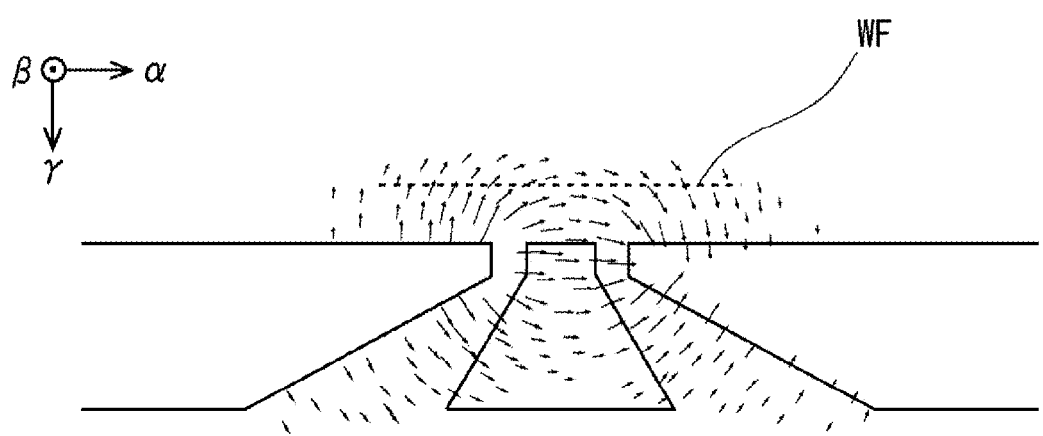
FIG. 7 is a view illustrating magnetic flux density vectors in an α-γ plane according to a first embodiment.

FIG. 6 is a graph illustrating magnetic flux densities in an α-axis direction along a first scan axis, and magnetic flux densities in a β-axis direction and a γ-axis direction, perpendicular to the first scan axis, according to a first embodiment. In this embodiment a horizontal axis represents a position along an α axis and a vertical axis represents magnetic flux density. FIG. 7 is a view illustrating magnetic flux density vectors in a α-γ plane according to a first embodiment.

As illustrated in FIGS. 6 and 7, in a first magnetic field, a direction of a magnetic field component in a vertical direction may change from one direction to an opposite direction, depending on a position on a stage surface 13. A magnetic field component in a direction parallel to the stage surface 13 may be constant. For example, between an end portion of an in-plane portion 24*a* of a yoke 22*a* and an end portion of an in-plane portion 24*b* of a yoke 22*b*, a magnetic field component in a γ-axis direction may be inverted. For example, a magnetic field component in an α-axis direction may be a predetermined value and may be constant, and a magnetic field component in a β-axis direction may be zero (0). In this manner, when a position of an MRAM element is changed such that a direction of the magnetic field component in the γ-axis direction in the first magnetic field changes from one direction to an opposite direction, a magnetic field component in a direction perpendicular to the α-axis direction and perpendicular to the γ-axis direction, may be zero (0). In this case, that the magnetic field component may be zero (0) refers not only to strictly zero (0), but also may refer to zero (0) within a range including unavoidable measurement errors.

A stage 10 may move a wafer WF along a first scan axis to change the sign of the magnetic field component in the vertical direction that is applied to the MRAM element included in the wafer WF. The magnetic field component in the β-axis direction at zero (0) may be maintained.

In this manner, a plurality of electromagnets 20 may generate a magnetic field including a magnetic field component in a magnetic easy-axis direction. The magnetic easy-axis direction may be, for example, the Z-axis direction that is perpendicular to the stage surface 13. The plurality of electromagnets 20 may generate a first magnetic field in which the magnetic field component in the vertical direction changes from a first direction to a second direction, opposite to the first direction, according to a position on the stage surface 13.

<2-3. Applying Magnetic Field in a Direction, Parallel to Stage Surface>

Figure 8:
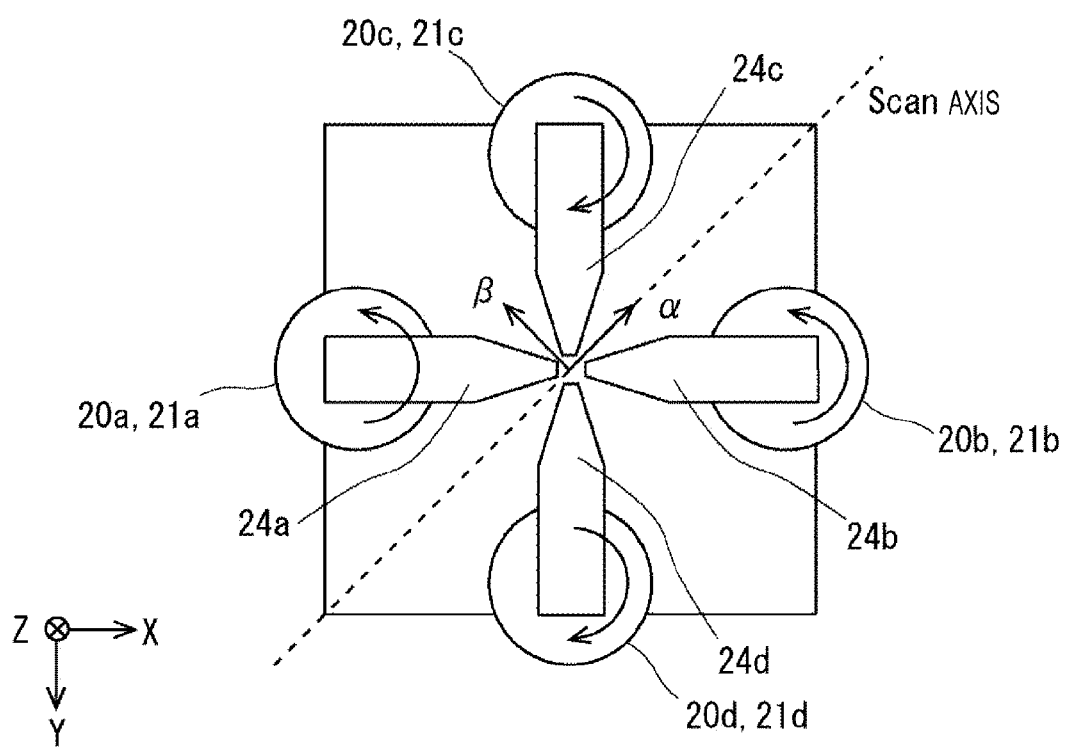
FIG. 8 is a view illustrating a direction of a current applied to a coil for applying a magnetic field having a magnetic field component in a direction, parallel to a stage surface, to an MRAM element, according to a first embodiment.

FIG. 8 a view illustrating a direction of a current applied to a coil 21 for applying a magnetic field having a magnetic field component in a direction that is parallel to a stage surface 13 to an MRAM element, according to a first embodiment. As illustrated in FIG. 8, when a magnetic field having a magnetic field component in a direction, parallel to a stage surface 13 is applied to an MRAM element, a current in the same predetermined direction may be applied to coils 21a and 21b of electromagnets 20a and 20b opposing in the X-axis direction. A current in a direction, opposite to that of the coils 21a and 21b, may be applied to coils 21c and 21d of electromagnets 20c and 20d, which oppose each other in the Y-axis direction.

For example, a magnetic field having a magnetic field component in a direction that is parallel to the stage surface 13, may be generated by flowing a current in a predetermined direction through the coils 21a and 21b, and flowing a current in a direction, opposite to the predetermined direction, to the coils 21c and 21d. A magnetic field having a magnetic field component in a direction that is parallel to the stage surface 13 may be referred to as a second magnetic field. Further, a direction that is parallel to the stage surface 13, may be referred to as an in-plane direction. When XYZ Cartesian coordinate axes are fixed to a plurality of electromagnets 20 in the second magnetic field, an α-axis direction having an angle of 45° with regard to an X-axis and an Y-axis may be taken as a scan axis. The scan axis in the second magnetic field may be referred to as a second scan axis. A direction that is orthogonal to the α-axis direction in an X-Y plane may be referred to as a β-axis direction. A direction that is orthogonal to the α-axis direction and the β-axis direction, may be referred to as a γ-axis. The γ-axis may be in the same direction as a Z-axis.

Figure 9:
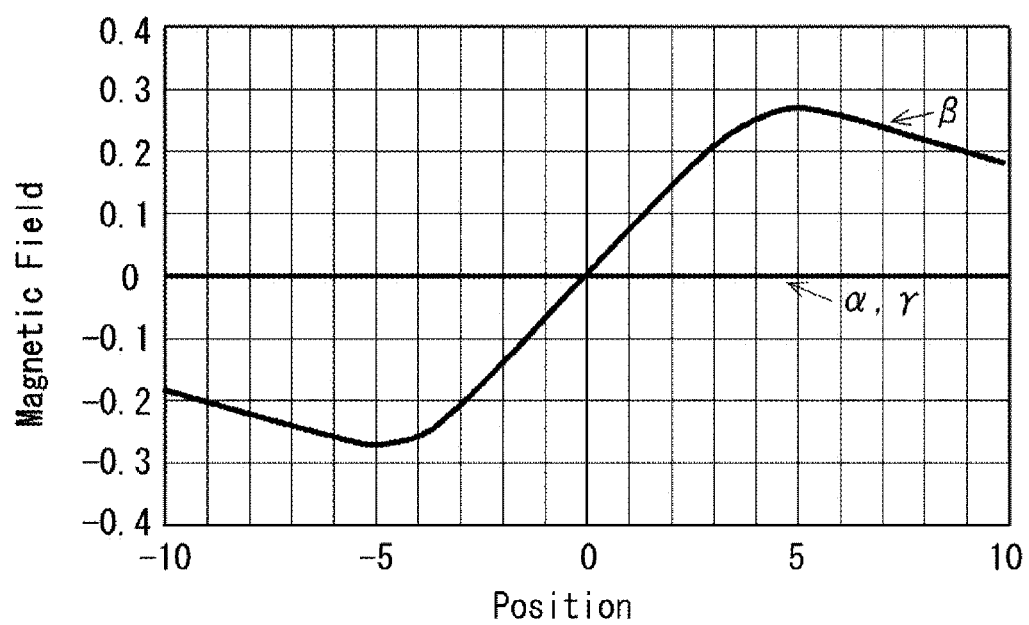
FIG. 9 is a graph illustrating magnetic flux densities in an α-axis direction along a second scan axis, and magnetic flux densities in a β-axis direction and a γ-axis direction, perpendicular to the second scan axis, according to a first embodiment, in which a horizontal axis represents a position along an a axis and a vertical axis represents magnetic flux density.
Figure 10:
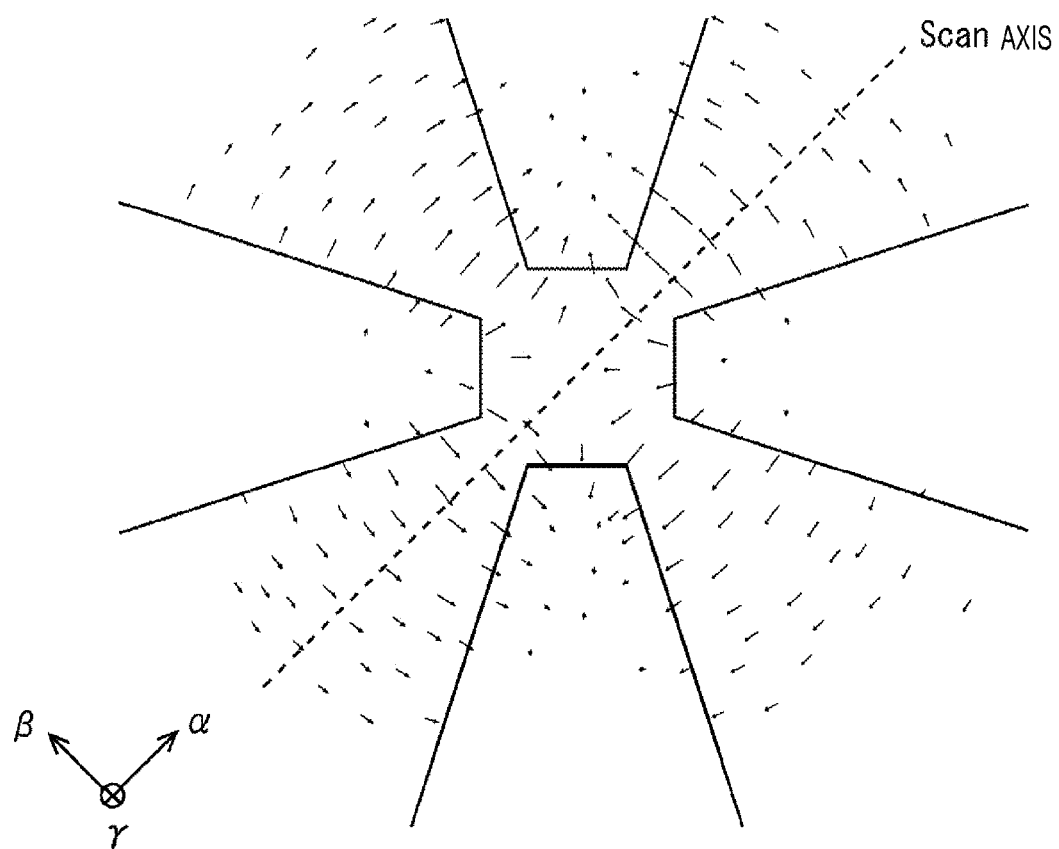
FIG. 10 is a view illustrating magnetic flux density vectors in an α-β plane according to a first embodiment.

FIG. 9 is a graph illustrating magnetic flux densities in an α-axis direction along a second scan axis, and magnetic flux densities in a β-axis direction and a γ-axis direction, perpendicular to the second scan axis, according to a first embodiment. In FIG. 9 a horizontal axis represents a position along an a axis and a vertical axis represents magnetic flux density. FIG. 10 is a view illustrating magnetic flux density vectors in an α-β plane according to a first embodiment.

As illustrated in FIGS. 9 and 10, in a second magnetic field, a direction of a magnetic field component in an in-plane direction may change from one direction to an opposite direction, depending on a position on a stage surface 13. A magnetic field component in a vertical direction that is perpendicular to the stage surface 13 may be zero (0). For example, in a space surrounded by an end portion of an in-plane portion 24a of a yoke 22a, an end portion of an in-plane portion 24b of a yoke 22b, an end portion of an in-plane portion 24c of a yoke 22c, and an end portion of the in-plane portion 24d of a yoke 22d, a magnetic field component in a β-axis direction may be inverted, and magnetic field components in a α-axis direction and a γ-axis direction may be zero (0). In this manner, when a position of an MRAM element is changed, such that a direction of the magnetic field component in the β-axis direction in the second magnetic field changes from one direction to an opposite direction, the magnetic field component in the α-axis direction and the magnetic field component in the γ-axis direction may be zero (0). In this case, that the magnetic field component may be zero (0) may indicate not only that the magnetic field component is strictly zero (0), but also may indicate that the magnetic field component is within a range that includes unavoidable measurement errors.

A stage 10 may move a wafer WF along a second scan axis, to change a sign of the magnetic field component in the β-axis direction applied to the MRAM element included in the wafer WF. Thus, the magnetic field component in the α-axis direction and the magnetic field component in the γ-axis direction may be maintained at zero (0).

In this manner, a plurality of electromagnets 20 may generate a magnetic field including a magnetic field component in a magnetic hard-axis direction. The magnetic hard-axis direction may be, for example, a direction that is perpendicular to the magnetic easy-axis direction. The plurality of electromagnets 20 may generate a second magnetic field in which the magnetic field component in the in-plane direction parallel to the stage surface 13 changes from a third direction to a fourth direction, opposite to the third direction, according to a position on the stage surface 13.

<3. Optical System>

Referring back to FIG. 1, the optical system 30 may include an optical microscope. The optical microscope may capture an image on the surface of the wafer WF. The optical system 30 may illuminate the MRAM element with illumination light containing polarized light, and may condense reflected light from which the illumination light is reflected from the MRAM element. The optical system 30 may include a light source 31, lenses L1 to L3, a polarizer 32, a mirror M1, an objective lens 33, and an analyzer 34. The optical system 30 may include an optical element, in addition to the above.

The light source 31 may emit illumination light. The illumination light may be, for example, a laser light. The illumination light emitted from the light source 31 may be converted by the polarizer 32 to include linearly polarized light. The illumination light including the linearly polarized light may be reflected by the mirror M1, and may be condensed on the wafer WF by the objective lens 33. The mirror M1 may be, for example, a non-polarization beam splitter.

The objective lens 33 may acquire an image of a pattern on the wafer WF, and may be generally selected to be non-magnetic. When the wafer WF is the MRAM element, a polarized light angle of the linearly polarized light may be changed due to a magneto-optical Kerr effect.

Figure 11:
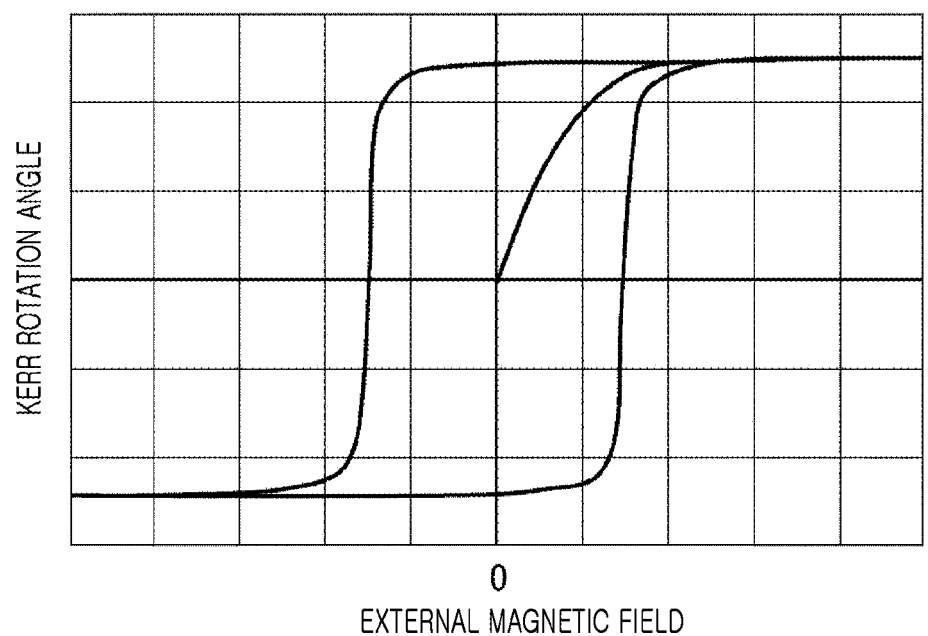
FIG. 11 is a view illustrating magnetic characteristics of an MRAM element, in which a horizontal axis represents an external magnetic field and a vertical axis represents a Kerr rotation angle.

FIG. 11 is a graph illustrating magnetic characteristics of an MRAM element in which a horizontal axis represents an external magnetic field and a vertical axis represents a Kerr rotation angle. As illustrated in FIG. 11, when an external magnetic field increases from 0, a Kerr rotation angle may increase. The Kerr rotation angle may become saturated when the external magnetic field reaches a certain constant value. The Kerr rotation angle may not change even when the external magnetic field increases. When the external magnetic field decreases from a saturated state, the rotation angle may become smaller. Even when the external magnetic field is set to 0, the Kerr rotation angle may still remain. When the external magnetic field is further reduced, the Kerr rotation angle may reach a certain constant value to be saturated. Therefore, even when the external magnetic field is reduced, the Kerr rotation angle may not be changed. When the external magnetic field increases from a saturated state, the Kerr rotation angle may increase. There may be a difference in the path of values of the Kerr rotation angle when the external magnetic field increases and when the external magnetic field decreases. In this manner, the Kerr rotation angle may form a hysteresis curve passing through different routes when the external magnetic field increases and when the external magnetic field decreases.

Figure 12:
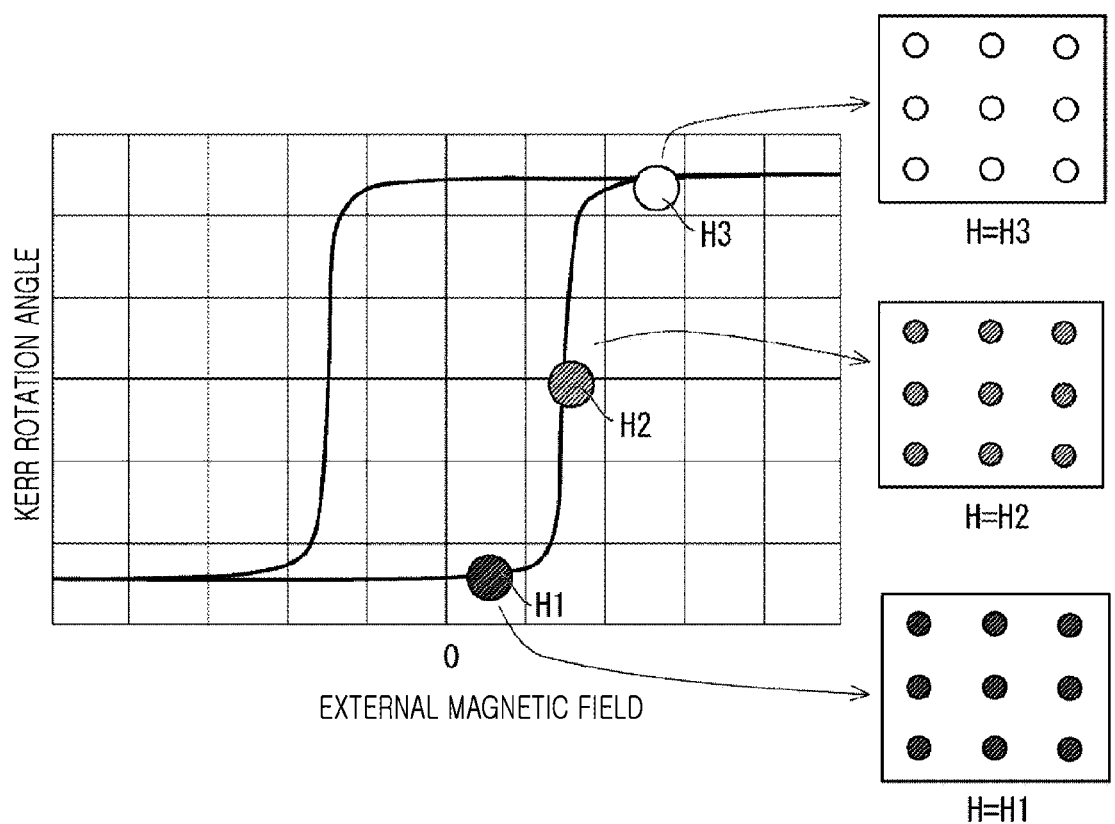
FIG. 12 is a view illustrating magnetic characteristics of an MRAM element, in which a horizontal axis represents an external magnetic field and a vertical axis represents a Kerr rotation angle.

FIG. 12 is a view illustrating magnetic characteristics of an MRAM element, in which a horizontal axis represents an external magnetic field and a vertical axis represents a Kerr rotation angle. FIG. 12 also schematically illustrates an image including a polarized light state of an MRAM element when an external magnetic field H is H1, H2 and H3. As illustrated in FIG. 12, an image captured when an external magnetic field gradually increases illustrates luminance according to different Kerr rotation angles in the external magnetic field H=H1, H2, and H3. A Kerr rotation angle and luminance detected by a detector 40 may be correlated. Therefore, from an image obtained by the detector 40, coercivity of each MRAM element (a magnetic field of an image of H2 in the above example) and deviation thereof may be acquired. When a size of the MRAM element is smaller than the resolution or optical resolution of a camera, average magnetic characteristics of an observation area may be acquired.

Reflected light that is reflected by the wafer WF may pass through the objective lens 33 and the mirror M1 to enter the analyzer 34. The analyzer 34 may detect a change in the polarized light angle of linearly polarized light included in the reflected light. The reflected light transmitted through the analyzer 34 may enter the detector 40.

<4. Detector>

The detector 40 may detect reflected light to acquire a pattern of the wafer WF. The detector 40 may also include a line sensor 41. The line sensor 41 may include, for example, time delay integration (TDI). The detector 40 may detect reflected light when a position of the MRAM element in the first magnetic field is changed, and reflected light when a position of the MRAM element in the second magnetic field is changed. For example, the detector 40 may detect reflected light when a position of the MRAM element in the first magnetic field is scanned in the first scan axis direction. Further, the detector 40 may detect reflected light when a position of the MRAM element in the second magnetic field is scanned in the second scan axis direction.

The inspection device 1 may irradiate the wafer WF with illumination light linearly polarized by the polarizer 32. The illumination light may pass reflected light thereof through the analyzer 34 to enter the detector 40. An amount of light entering the detector 40 by the analyzer 34 may change according to a polarized light angle. Accordingly, magnetization distribution may be imaged. The inspection device 1 may change a magnetic field applied to the MRAM element to measure magnetic characteristics of the MRAM element in the wafer WF from the distribution of polarized light angles according to the magnetic field.

Figure 13:
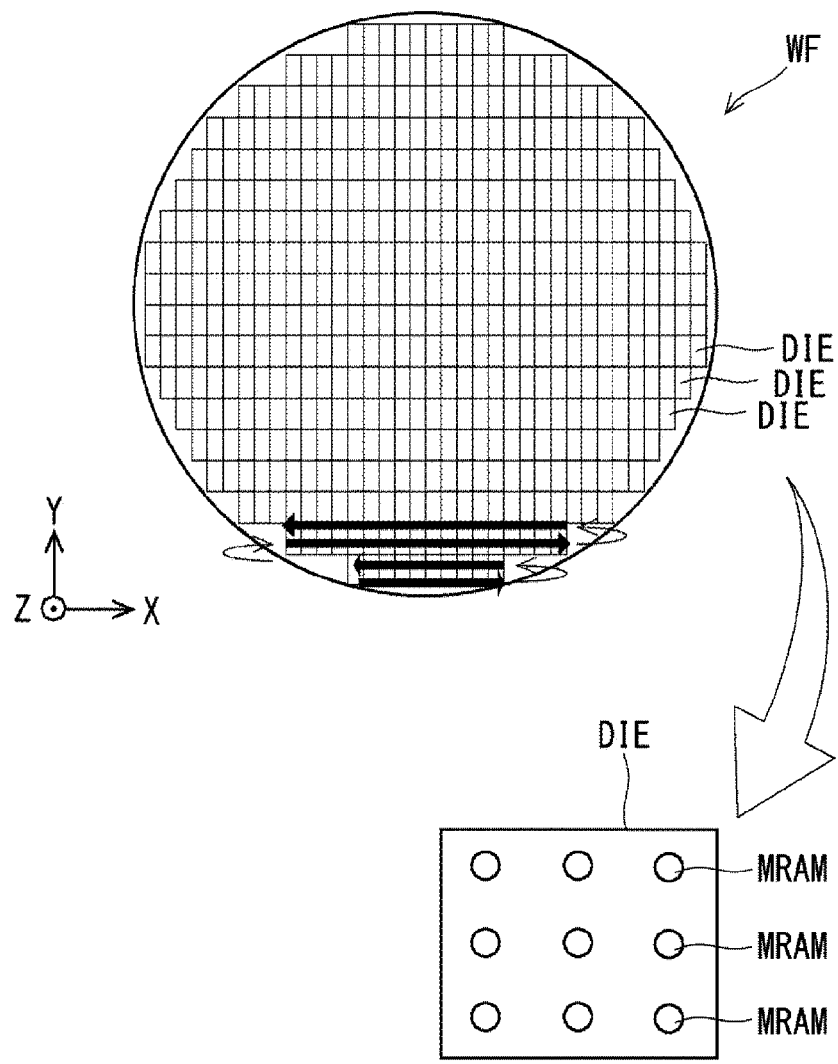
FIG. 13 is a plan view illustrating a wafer according to a first embodiment.

FIG. 13 is a plan view illustrating a wafer WF according to a first embodiment. As illustrated in FIG. 13, a wafer WF may include a plurality of dies DIE. Only a beta film of a perpendicular magnetization layer, before formation of a die DIE, may be inspected. For example, the beta film of the perpendicular magnetization layer may refer to a flat perpendicular magnetization layer as it is before being patterned into a plurality of MTJs. The die DIE may be, for example, a rectangle having short sides and long sides in the X-axis direction and the Y-axis direction. In the wafer WF, the plurality of dies DIE may be arranged to have a repeating periodicity spatially located in the X-axis direction and the Y-axis direction. The die DIE may include a plurality of MRAM elements. An MRAM element may have a storage region having a repeating periodicity arranged in an array. A line sensor 41 may acquire an image in a forward direction while moving, for example, in the X-axis direction to cross the plurality of dies DIE. After acquiring one column of images in the X-axis direction, the line sensor 41 may move in the Y-axis direction, and may acquire another column of images in the X-axis direction from a reverse direction. In inspecting all of the dies DIE of the wafer WF, the line sensor 41 may acquire images without intervals including several pixels for filter processing or scan correction, in the reverse and forward directions.

<5. Information Processing Unit>

An information processing unit 50 may process an image of reflected light detected by a detector 40. For example, the information processing unit 50 may be an information processing device such as a server device, a personal computer, or the like. The information processing unit 50 may inspect a defect of an MRAM element by a magnetic field component in the vertical direction, according to an image between an image in a magnetic field component in one direction of the vertical direction and an image in a magnetic field component in the opposite direction, in a first magnetic field. Further, the information processing unit 50 may inspect a defect of an MRAM element, by a magnetic field component in the in-plane direction, according to an image difference between an image in a magnetic field component in one direction of the in-plane direction and an image in a magnetic field component in the opposite direction, in a second magnetic field.

<6. Details of Inspection Device>

Figure 14:
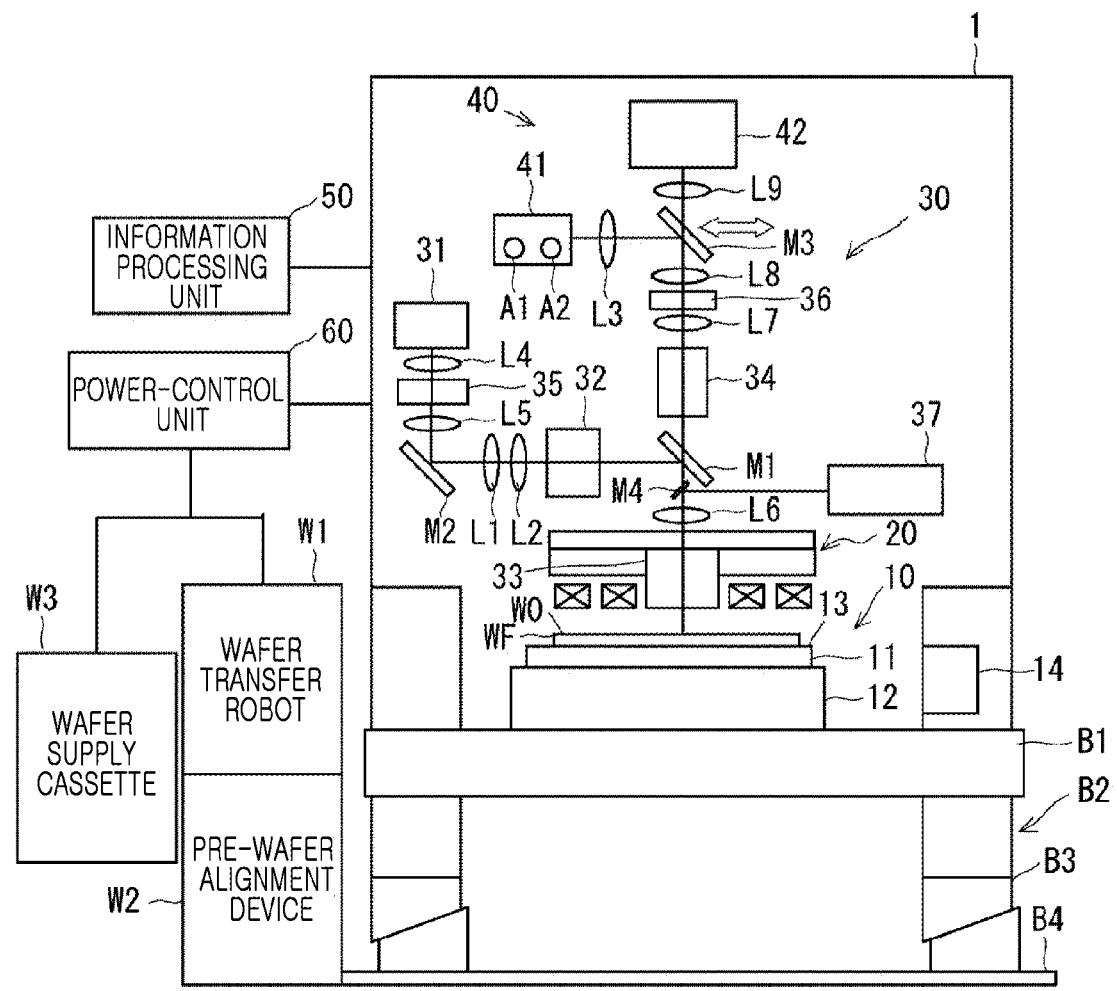
FIG. 14 is a configuration diagram illustrating details of an inspection device according to a first embodiment.

Next, details of an inspection device according to a first embodiment will be described. FIG. 14 is a configuration diagram illustrating details of an inspection device according to a first embodiment. As illustrated in FIG. 14, an inspection device 1 may further include devices W1 to W3 relating to the transfer of a wafer WF, members B1 to B4 for supporting the inspection device 1, and a power-control unit 60.

The devices W1 to W3 relating to the transfer of a wafer WF may include a wafer transfer robot W1, a pre-wafer alignment device W2, and a wafer supply cassette W3. The wafer transfer robot W1 may transfer a wafer WF to be inspected from the wafer supply cassette W3 to an internal space of the inspection device 1. The pre-wafer alignment device W2 may correct a rotation angle and shift of the wafer WF. The wafer WF may be transferred to a stage 10 of the inspection device 1 after being adjusted by the pre-wafer alignment device W2.

The members B1 to B4 for supporting the inspection device 1 may include a base B1, an active isolator B2, a wedge B3, and a distribution plate B4. The base B1 may serve as a base on which members such as the stage 10, an optical system 30, or the like are arranged. The active isolator B2 may suppress vibration of the members on the base B1. The wedge B3 may perform horizontal adjustment of the base B1 and the active isolator B2. The distribution plate B4 may distribute the load of the device to a floor. The power-control unit 60 may control each element of the inspection device 1 while supplying power to the inspection device 1.

The optical system 30 may further include lenses L4 to L9, mirrors M2 to M4, and filters 35 and 36. Illumination light emitted from a light source 31 may pass through the filter 35 via the lens L4, to include a predetermined wavelength band. The illumination light transmitted through the filter 35 may be reflected by the mirror M2 via the lens L5. The illumination light reflected by the mirror M2 may pass through a polarizer 32 via lenses L1 and L2. The polarizer 32 may convert the illumination light to include linearly polarized light. The illumination light including the linearly polarized light may be reflected by a mirror M1, and may be condensed on the wafer WF by an objective lens 33 via the lens L6. The mirror M2 may be, for example, a non-polarizating beam splitter.

The reflected light reflected by the wafer WF may pass through the objective lens 33, the lens L6 and the mirror M1. The reflected light may then enter an analyzer 34. The analyzer 34 may function as an analyzer that detects a change in the polarized light angle of the linearly polarized light included in the reflected light. The reflected light passing through the analyzer 34 and the lens L7 may include a predetermined wavelength band in the filter 36. The reflected light passing through the filter 36 may be reflected by the mirror M3 via the lens L8. The reflected light reflected by the mirror M3 may enter the line sensor 41 via the lens L3. An AF sensor 37 may be a member that connects focal points of a surface of the wafer WF. The AF sensor 37 may irradiate the wafer WF with light from the mirror M4, and may introduce reflected light to perform focus adjustments. The AF sensor 37 may use laser light that is longer or shorter than the wavelengths of the illumination light and the reflected light used in the optical system 30.

A detector 40 may acquire a pattern of the wafer WF. The detector 40 may have a plurality of line sensors A1 and A2 and a review monitor 42. The plurality of line sensors A1 and A2 are not limited to two (2), but may be three (3) or more. The detector 40 may include, for example, a time delay integration (TDI) sensor. The review monitor 42 may detect reflected light transmitted through the mirror M3 via the lens L9. The review monitor 42 may include a charge-coupled device (CCD) sensor. The CCD sensor may be used for review. The mirror M3 may be inserted to switch optical paths of the line sensors L1 and L2 and the review monitor 42.

<7. Inspection Method>

Figure 15:
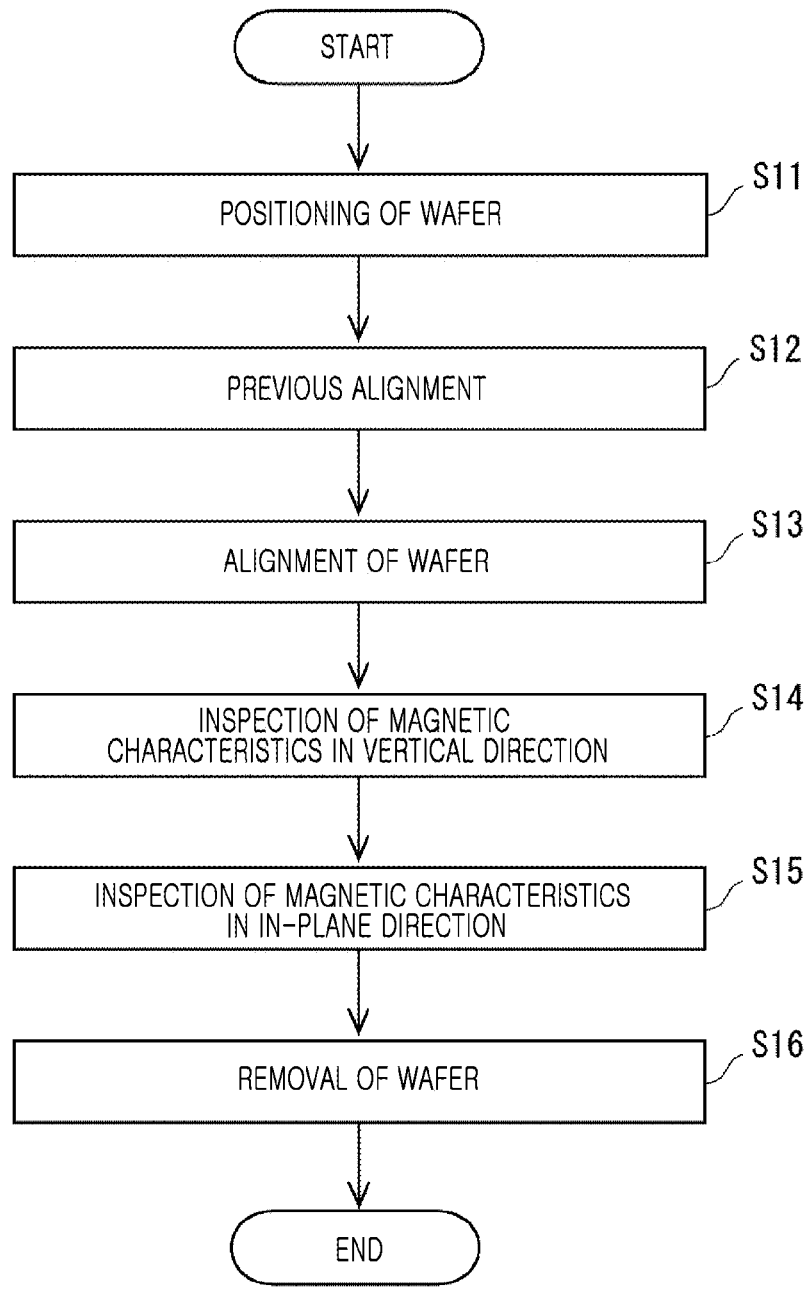
FIG. 15 is a flowchart diagram illustrating a method for inspecting a wafer including an MRAM element according to a first embodiment.

Next, an inspection method will be explained. FIG. 15 is a flowchart diagram illustrating a method for inspecting a wafer including an MRAM element according to a first embodiment. As illustrated in S11 of FIG. 15, first, a wafer WF may be positioned in an inspection device 1. For example, a wafer transfer robot W1 may transfer a wafer WF to be inspected from a wafer supply cassette W3 to an internal space of the inspection device 1.

Next, as illustrated in S12, a pre-wafer alignment device W2 may correct a rotation angle and shifting of the wafer WF. The wafer WF may be transferred to a stage 10 of the inspection device 1 after being adjusted by the pre-wafer alignment device W2. Next, as illustrated in S13, positioning of the wafer WF may be performed on the stage 10. For example, alignment of the wafer WF may be performed using a laser interferometer 14.

Next, as illustrated in S14, magnetic characteristics of an MRAM element in the vertical direction may be inspected. Further, as illustrated in S15, magnetic characteristics of the MRAM element in the in-plane direction may be inspected. The order of S14 and S15 is not limited to thereto. After magnetic characteristics of the MRAM element in the in-plane direction are inspected in S14, magnetic characteristics of the MRAM element in the vertical direction may be inspected in S15. Next, as illustrated in S16, the wafer WF may be removed from the stage 10, after the inspection.

Figure 16:
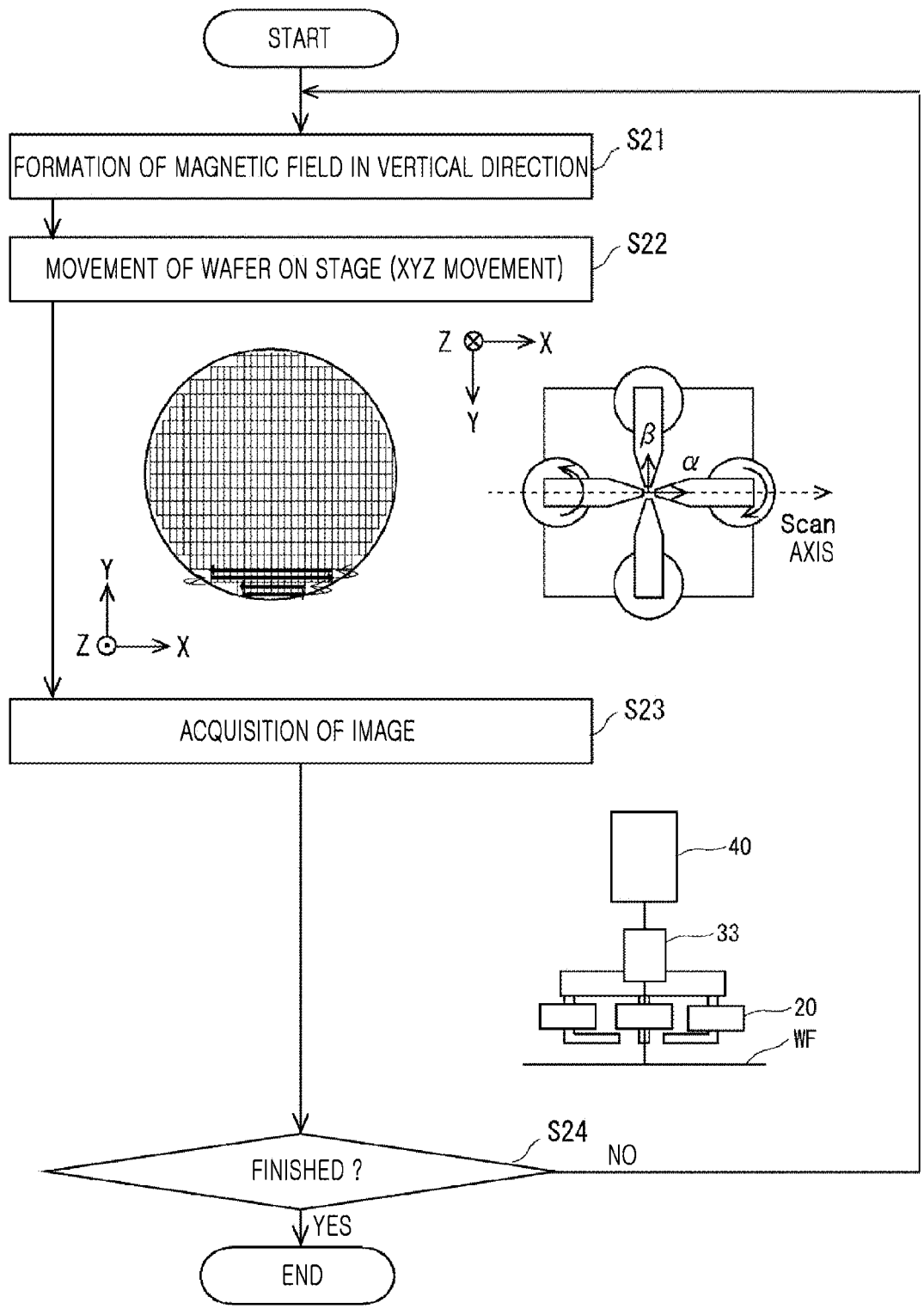
FIG. 16 is a flowchart diagram illustrating a method for inspecting magnetic characteristics in a vertical direction in an MRAM element according to a first embodiment.

FIG. 16 is a flowchart diagram illustrating a method for inspecting magnetic characteristics in a vertical direction in an MRAM element according to a first embodiment. As illustrated in S21 of FIG. 16, a first magnetic field having a magnetic field component in a direction that is perpendicular to a stage surface 13, may be formed using a plurality of electromagnets 20. For example, an inspection device 1 may apply currents in opposite directions to coils 21a and 21b of electromagnets 20a and 20b opposing each other in the X-axis direction, and may not apply a current to coils 21c and 21d of electromagnets 20c and 20d, which oppose each other in the Y-axis direction, to generate the first magnetic field.

Next, as illustrated in S22, a wafer WF on a stage 10 may be moved. For example, the wafer WF may be moved along an α-axis serving as a first scan axis, to scan an MRAM element in the first magnetic field. When moving in the first magnetic field, an α-axis direction that serves as the first scan axis may be the X-axis direction.

Next, as illustrated in S23, an image of a magneto-optical effect of the MRAM element of the wafer WF may be acquired by a detector 40. For example, a polarized light angle due to the magneto-optical effect of the MRAM element may be measured. Then, the MRAM element may be inspected by performing a defect inspection using the first magnetic field having a magnetic field component in the vertical direction from a difference image before and after a change in magnetic polarity during the scanning.

Next, as illustrated in S24, it may be determined whether or not to finish the inspection. When the MRAM element to be inspected is still present (No in S24), the process may return to S21, and the processes referred to as S21 to S24 may be repeated. When there is no MRAM element to be inspected (Yes in S24), the inspection may end.

Figure 17:
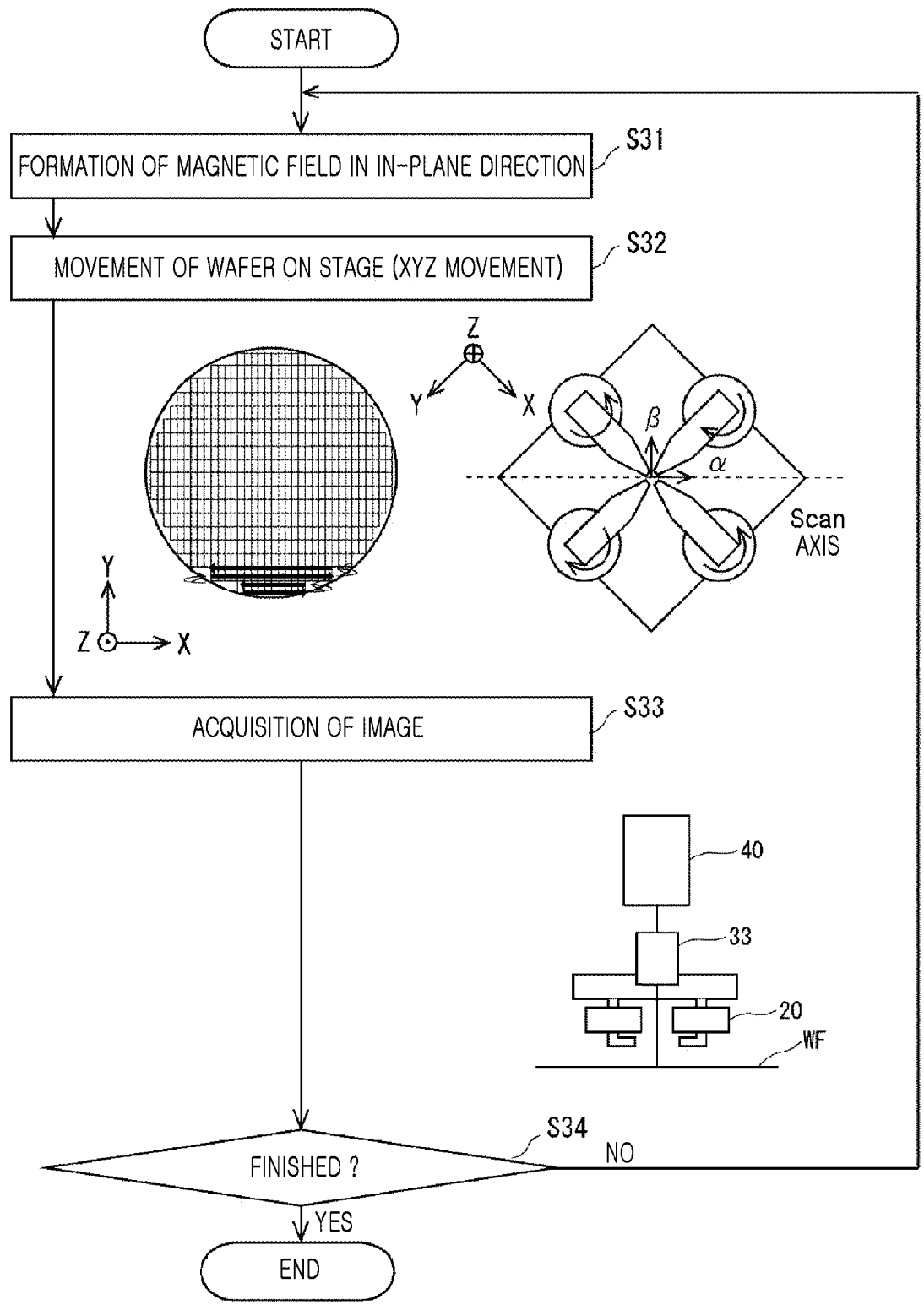
FIG. 17 is a flowchart diagram illustrating a method for inspecting magnetic characteristics in an in-plane direction in an MRAM element according to a first embodiment.

FIG. 17 is a flowchart diagram illustrating a method for inspecting magnetic characteristics in an in-plane direction of an MRAM element according to a first embodiment. As illustrated in S31 of FIG. 17, a second magnetic field having a magnetic field component in an in-plane direction parallel to a stage surface 13 may be formed using a plurality of electromagnets 20. For example, when an XYZ Cartesian coordinate axis system is fixed to the plurality of electromagnets 20, a current in the same predetermined direction may be applied to coils 21a and 21b of electromagnets 20a and 20b opposing each other in the X-axis direction. A current in a direction opposite to that of the coils 21a and 21b may be applied to coils 21c and 21d of electromagnets 20c and 20d opposing each other in the Y-axis direction. In the present embodiment, the plurality of electromagnets 20 may be rotated by 45° on a horizontal plane, and the second scan axis may be aligned with an X axis of the XYZ Cartesian coordinate axis system, fixed to a stage 10.

Next, as illustrated in S32, a wafer WF on the stage 10 may be moved. Specifically, an MRAM element may move in the second magnetic field, as the wafer WF moves along an α-axis serving as a second scan axis.

Next, as illustrated in S33, a detector 40 may acquire an image of a magneto-optical effect in the MRAM element of the wafer WF. Specifically, a polarized light angle due to the magneto-optical effect of the MRAM element may be measured to inspect the MRAM element.

Next, as illustrated in S34, it may be determined whether or not to finish the inspection. When the MRAM element to be inspected still exists (No in S34), the processes referred to as S31 to S34 may be repeated. When there is no MRAM element to be inspected (Yes in S34), the inspection may end.

Next, effects of the present embodiment will be described. An inspection device 1 of the present embodiment may form a first magnetic field in which a direction of a magnetic field component in the vertical direction changes from a first direction to a second direction, depending on a position on a stage surface 13, and a second magnetic field in which a direction of a magnetic field component in the in-plane direction changes from a third direction to a fourth direction, depending on a position on the stage surface 13, for inspection of a defect of an MRAM element. Therefore, the inspection device 1 may detect magnetic characteristics in a magnetic easy-axis direction as well as a magnetic hard-axis direction, and the detection accuracy of MRAM characteristics may be improved.

An inspection device according to related art may involve scanning an MRAM element to detect a defect in the MRAM element in a gradient magnetic field formed by an electromagnet including two coils. The inspection device according to related art may measure saturation magnetization characteristics by applying a magnetic field in the magnetic easy-axis direction, which may be a magnetic field component in the vertical direction of the gradient magnetic field. Therefore, the inspection device according to related art may provide wafer defect inspection. However, to identify the characteristics of the MRAM element, it may be necessary to inspect not only the characteristics of a magnetic easy-axis direction, which may be a direction of easy magnetization, but also magnetization characteristics of a magnetic hard-axis direction. In particular, an anisotropic magnetic field in a magnetic hard-axis direction should be inspected without changing the magnetic characteristics in the magnetic easy-axis direction, which may change characteristics with a small magnetic field. Since the inspection device of related art may not detect the magnetic characteristics in the magnetic hard-axis direction, detection accuracy of MRAM characteristics may not be improved.

In contrast, the inspection device 1 of the present embodiment may detect magnetic characteristics in a magnetic easy-axis direction without changing magnetic characteristics in a magnetic hard-axis direction. The inspection device 1 of the present embodiment may simultaneously detect the magnetization characteristics in the magnetic hard-axis direction without changing the magnetization characteristics in the magnetic easy-axis direction. Therefore, detection accuracy of MRAM characteristics may be improved.

In addition, the inspection device 1 of the present embodiment may perform an inspection by moving the MRAM element in a first magnetic field and in a second magnetic field. In contrast, a method of changing a magnetic field by fixing a stage 10 and changing a current flowing through an electromagnet may require time to change the current. In addition, to detect high sensitivity, it may be necessary to increase an exposure time of a camera. For example, when inspecting an entire surface of a wafer WF, it may be desirable to repeat a measurement of changing the current flowing through the electromagnet after each MRAM element in the wafer WF is moved to an inspection position. Therefore, an increase in inspection time could become a problem.

In the present embodiment, since it may not be necessary to change the current flowing in the coil 21 of the electromagnet 20 during the inspection, the time for changing the current may be shortened. In addition, since the magnetic characteristics may be detected by the movement of the MRAM element, the exposure time of the detector 40 may be shortened.

Second Embodiment

Next, an inspection element according to a second embodiment will be described. After inspection of magnetic characteristics in the vertical direction, the inspection element 1 of the first embodiment described above may rotate the plurality of electromagnets 20 by 45° to scan the MRAM element. An inspection element of the present embodiment may rotate a stage 10 by 45° to scan an MRAM element, after inspection of magnetic characteristics in the vertical direction.

Figure 18:
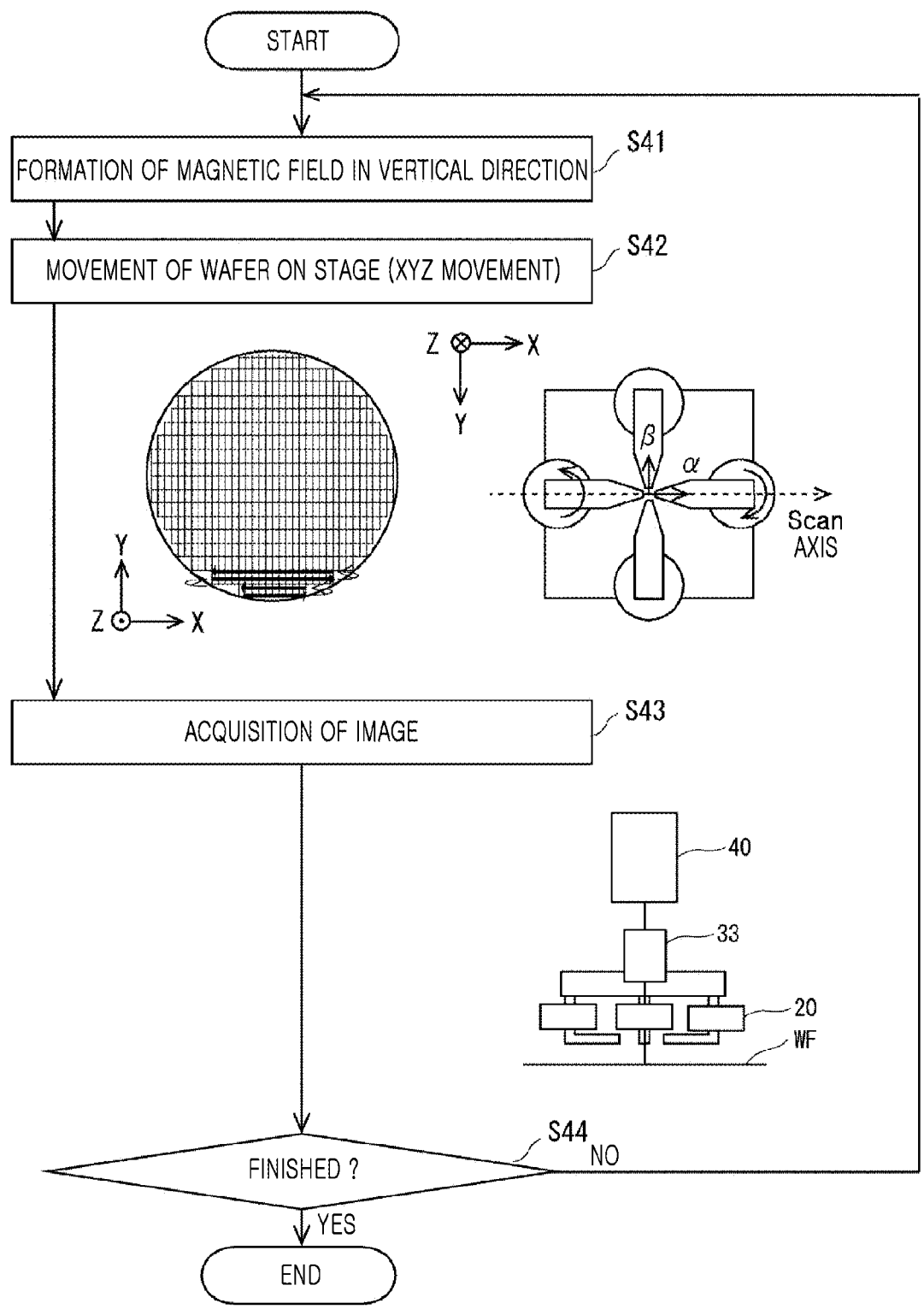
FIG. 18 is a flowchart diagram illustrating a method for inspecting magnetic characteristics in a vertical direction in an MRAM element according to a second embodiment.

FIG. 18 is a flowchart diagram illustrating a method for inspecting magnetic characteristics in a vertical direction in an MRAM element according to a second embodiment. As illustrated in S41 of FIG. 18, a first magnetic field having a magnetic field component in a direction that is perpendicular to a stage surface 13 may be formed using a plurality of electromagnets 20. For example, currents in opposite directions may be applied to coils 21a and 21b of electromagnets 20a and 20b opposing each other in the X-axis direction. No current may be applied to two coils 21c and 21d of electromagnets 20c and 20d opposing each other in the Y-axis direction.

Next, as illustrated in S42, a wafer WF on a stage 10 may be moved. Specifically, the wafer WF may be moved along an α-axis serving as a first scan axis, to scan an MRAM element in the first magnetic field. When moving in the first magnetic field, an α-axis direction serving as the first scan axis may be the X-axis direction.

Next, as illustrated in S43, an image of a magneto-optical effect in the MRAM element of the wafer WF may be acquired by a detector 40. Specifically, a polarized light angle due to the magneto-optical effect of the MRAM element may be measured. Then, the MRAM element may be inspected by performing a defect inspection using the first magnetic field having a magnetic field component in the vertical direction from a difference image before and after a change in magnetic polarity during the scanning.

Next, as illustrated in S44, it may be determined whether or not to finish the inspection. When the MRAM element to be inspected still exists (No in S44), the process may return to S41, and S41 to S44 may be repeated. When there is no MRAM element to be inspected (Yes in S44), the inspection may end.

Figure 19:
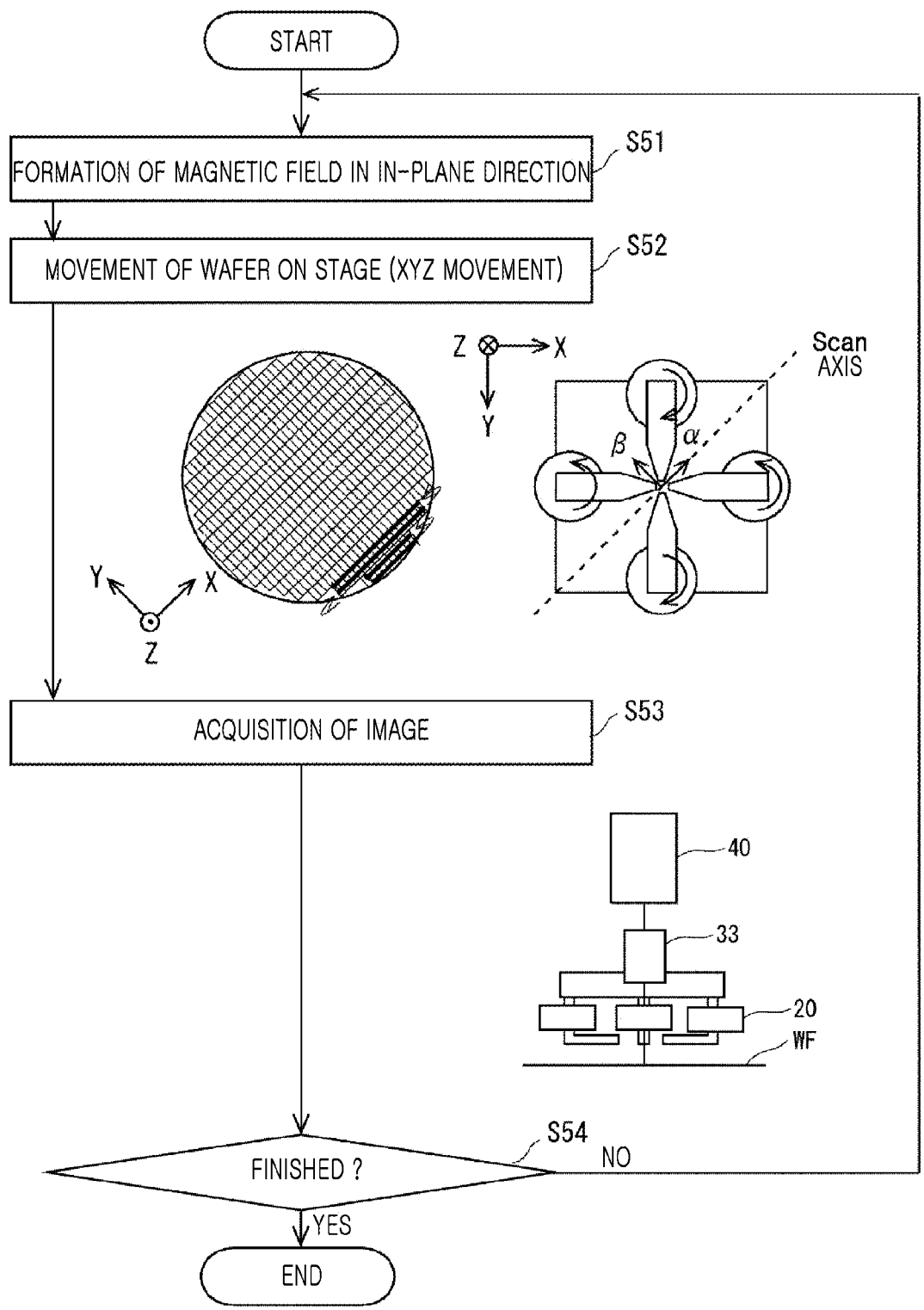
FIG. 19 is a flowchart diagram illustrating a method for inspecting magnetic characteristics in an in-plane direction in an MRAM element according to a second embodiment.

FIG. 19 is a flowchart diagram illustrating a method for inspecting magnetic characteristics in an in-plane direction in an MRAM element according to a second embodiment. As illustrated in S51 of FIG. 19, a second magnetic field having a magnetic field component in an in-plane direction, parallel to a stage surface 13, may be formed. For example, when an XYZ Cartesian coordinate axis system is fixed to a plurality of electromagnets 20, a current in the same predetermined direction may be applied to coils 21a and 21b of electromagnets 20a and 20b opposing each other in the X-axis direction. A current in a direction, opposite to that of the coils 21a and 21b, may be applied to coils 21c and 21d of electromagnets 20c and 20d opposing each other in the Y-axis direction. In the present embodiment, the plurality of electromagnets 20 may be rotated by 45° on a horizontal plane, and the second scan axis may be aligned with an X axis of the XYZ Cartesian coordinate axis system, fixed to a stage 10.

Next, as illustrated in S52, a wafer WF on the stage 10 may be moved. Specifically, an MRAM element may move in the magnetic field, as the wafer WF moves along an α-axis serving as a second scan axis.

Next, as illustrated in S53, a detector 40 may acquire an image of a magneto-optical effect in the MRAM element of the wafer WF. Specifically, a polarized light angle due to the magneto-optical effect of the MRAM element may be measured to inspect the MRAM element.

Next, as illustrated in S54, it may be determined whether or not to finish the inspection. When the MRAM element to be inspected still exists (No in S54), the process may return to S51, and S51 to S54 may be repeated. When there is no MRAM element to be inspected (Yes in S54), the inspection may end.

According to the present embodiment, the inspection device may rotate the moving portion 11 of the stage 10, instead of the plurality of electromagnets 20. Therefore, the inspection device may detect the magnetization characteristics of the MRAM element when a magnetic field in the in-plane direction is applied. Therefore, the inspection device may suppress positional displacement due to movement of the plurality of electromagnets 20 and the optical system 30.

Embodiments are not limited to the above descriptions, and is possible to change suitably in the scope which does not deviate from the spirit of the present inventive concept. For example, a combination of each of the configurations of first and second embodiments may be also within the scope of the technical idea of the embodiments.

Therefore, an inspection device with improved detection accuracy of magnetic characteristics of an MRAM may be provided.

In the inspection device, since a magnetic field in a horizontal direction may be almost constant before and after inverting a magnetic field of a vertical magnetic field (in a magnetic easy-axis direction), characteristics of the vertical magnetic field may be detected. However, the inspection device of related art may have difficulty in detecting a change in characteristics of the MRAM element according to a change in the magnetic field in the horizontal direction, and the detection accuracy of the magnetic characteristic of the MRAM element may not be improved.

Embodiments have been made to address such issues, and it is desirable to provide an inspection device that is capable of improving the detection accuracy of magnetic characteristics of an MRAM element An inspection device for scanning an MRAM device on a stage might use a gradient magnetic field generated between electromagnet yokes having two coils, to detect a defect in an MRAM element with a time delay integration (TDI) camera.

In contrast, an inspection device capable of improving detection accuracy of magnetic characteristics of an MRAM element by easily detecting a change in characteristics of the MRAM element in a magnetic easy-axis direction and a magnetic hard-axis direction may be provided. The inspection device may generate a first magnetic field in which a direction of a magnetic field component in a vertical direction, perpendicular to a stage surface, may be reversed according to a position on the stage surface by controlling current directions of at least four electromagnets. In the first magnetic field, a magnetic field component in a direction, perpendicular to the vertical direction, may be fixed to have a constant size. Accordingly, it is possible to easily detect a change in characteristics of the MRAM element in the magnetic easy-axis direction.

The inspection device may generate a second magnetic field in which a direction of a magnetic field component in an in-plane direction, parallel to the stage surface, may be reversed according to a position on the stage surface by controlling current directions of the electromagnets. In the second magnetic field, a magnitude of a magnetic field component in a direction, perpendicular to the in-plane direction, may be fixed to be '0.' Accordingly, a change in characteristics of the MRAM element in the magnetic hard-axis can also be easily detected Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. An inspection device comprising:
   a stage having a stage surface and fixing a magnetoresistive random access memory (MRAM) element on the stage surface;
   a plurality of electromagnets generating a first magnetic field in which a direction of a magnetic field component in a vertical direction, perpendicular to the stage surface, changes from a first direction to a second direction, opposite to the first direction, according to a position on the stage surface, and a second magnetic field in which a direction of a magnetic field component in an in-plane direction, parallel to the stage surface, changes from a third direction to a fourth direction, opposite to the third direction, according to the position on the stage surface;
   an optical system illuminating the MRAM element with illumination light including polarized light, and simultaneously condensing reflected light from which the illumination light is reflected from the MRAM element; and
   a detector detecting the reflected light when the position of the MRAM element in the first magnetic field is changed, and the reflected light when the position of the MRAM element in the second magnetic field is changed.

2. The inspection device as claimed in claim 1, wherein, when the position of the MRAM element is altered to change from the first direction to the second direction in the first magnetic field, a magnetic field component in a direction that is perpendicular to a first scan direction from the first direction to the second direction and perpendicular to the vertical direction, is 0.

3. The inspection device as claimed in claim 1, wherein, when the position of the MRAM element is altered to change from the third direction to the fourth direction in the second magnetic field, a magnetic field component in a second scan direction from the third direction to the fourth direction and the magnetic field component in the vertical direction is 0.

4. The inspection device as claimed in claim 1, wherein:
the plurality of electromagnets includes at least four electromagnets including a first electromagnet, a second electromagnet, a third electromagnet, and a fourth electromagnet,
the first electromagnet includes a first coil that is wound in a predetermined direction on a first vertical portion of a first yoke having an L-shape,
the first yoke has the first vertical portion extending in the vertical direction and a first in-plane portion extending in the in-plane direction,
the second electromagnet includes a second coil that is wound in the predetermined direction on a second vertical portion of a second yoke having an L-shape, wherein the second yoke has the second vertical portion extending in the vertical direction and a second in-plane portion extending in the in-plane direction,
the third electromagnet includes a third coil that is wound in the predetermined direction on a third vertical portion of a third yoke having an L-shape, wherein the third yoke has the third vertical portion extending in the vertical direction and a third in-plane portion extending in the in-plane direction,
the fourth electromagnet includes a fourth coil that is wound in the predetermined direction on a fourth vertical portion of a fourth yoke having an L-shape, wherein the fourth yoke has the fourth vertical portion extending in the vertical direction and a fourth in-plane portion extending in the in-plane direction,
the first in-plane portion and the second in-plane portion extend in one direction, and an end portion of the first in-plane portion and the end portion of the second in-plane portion oppose in the one direction, and
the third in-plane portion and the fourth in-plane portion extend in a direction, orthogonal to the one direction, and the end portion of the third in-plane portion and the end portion of the fourth in-plane portion oppose in the one direction.

5. The inspection device as claimed in claim 4, wherein
the first magnetic field is generated by flowing a current in a fifth direction through the first coil, flowing the current in a sixth direction, opposite to the fifth direction, through the second coil, and setting the current flowing in the third coil and the fourth coil to be 0, and
the second magnetic field is generated by flowing the current in the fifth direction through the first coil and the second coil, and simultaneously flowing the current in the sixth direction through the third coil and the fourth coil.

6. The inspection device as claimed in claim 5, wherein the fifth direction is a counterclockwise direction, and the sixth direction is a clockwise direction.

7. The inspection device as claimed in claim 4, further includes a connection plate connecting an upper end of the first vertical portion, an upper end of the second vertical portion, an upper end of the third vertical portion, and an upper end of the fourth vertical portion.

8. The inspection device as claimed in claim 4, wherein the detector detects the reflected light when the position of the MRAM element in the first magnetic field is scanned in the one direction, and detects the reflected light when the position of the MRAM element in the second magnetic field is scanned in a direction of 45 degrees with regard to the one direction and the direction orthogonal to the one direction.

9. The inspection device as claimed in claim 1, further comprising an information processing unit that processes an image of the reflected light detected by the detector, wherein the information processing unit performs an inspection of a defect in the MRAM element by the magnetic field component in the vertical direction, from a differing image between the image in a magnetic field component in the first direction and the image in a magnetic field component in the second direction.

10. The inspection device as claimed in claim 1, further comprising an information processing unit processing an image of the reflected light detected by the detector,
wherein the information processing unit performs an inspection of a defect in the MRAM element by the magnetic field component in the in-plane direction, from a differing image between the image in a magnetic field component in the third direction and the image in a magnetic field component in the fourth direction.

11. The inspection device as claimed in claim 1, further comprising:
a wafer supply cassette;
a wafer transfer robot transferring a wafer including the MRAM element from the wafer supply cassette to an internal space of the inspection device; and
a pre-wafer alignment device correcting a rotation angle and shift of the wafer.

12. The inspection device as claimed in claim 1, further comprising:
a base serving a base on which members such as the stage, and the optical system;
an active isolator suppressing vibration of the members on the base;
a wedge performing horizontal adjustment of the base and the active isolator; and
a distribution plane distributing a load of the inspection device to a floor,
a wafer transfer robot transferring a wafer including the MRAM element from the wafer supply cassette to an internal space of the inspection device; and
a pre-wafer alignment device correcting a rotation angle and shift of the wafer.

13. An inspection device comprising:
a stage having a stage surface and fixing a magnetoresistive random access memory (MRAM) element on the stage surface;
a first electromagnet, a second electromagnet, a third electromagnet and a fourth electromagnet each includes a yoke whose end faces a predetermined area and a coil wound around yoke in the same direction, wherein an end of a yoke of the first electromagnet and an end of a yoke of the second electromagnet are oppose in an one direction, and an end of a yoke of the third electromagnet and an end of a yoke of the fourth electromagnet are oppose in a direction orthogonal to the one direction;
an optical system illuminating the MRAM element with illumination light including polarized light, and simultaneously condensing reflected light from which the illumination light is reflected from the MRAM element; and
a detector detecting the reflected light when the position of the MRAM element in magnetic fields generated in the predetermined area is changed.

14. The inspection device as claimed in claim 13, wherein the magnetic field includes:
a first magnetic field in which a direction of a magnetic field component in a vertical direction, perpendicular to the stage surface, change from a first direction to a second direction, opposite to the first direction, according to a position on the stage surface, and a second magnetic field in which a direction of a magnetic field component in an in-plane direction, parallel to the stage surface, changes from a third direction to a fourth direction, opposite to the third direction, according to the position on the stage surface.

15. The inspection device as claimed in claim 14, wherein the first magnetic field is generated by flowing a current in a fifth direction through a coil of the first electromagnet, flowing the current in a sixth direction, opposite to the fifth direction, through a coil of the second electromagnet, and setting the current flowing in coils of the third and fourth electromagnet to be 0, and the second magnetic field is generated by flowing the current in the fifth direction through the coils of the first and second electromagnet, and simultaneously flowing the current in the sixth direction through the coils of the third and fourth electromagnet.

16. The inspection device as claimed in claim 15, wherein the fifth direction is a counterclockwise direction, and the sixth direction is a clockwise direction.

17. The inspection device as claimed in claim 14, wherein, when the position of the MRAM element is altered to change from the first direction to the second direction in the first magnetic field, a magnetic field component in a direction that is perpendicular to a first scan direction from the first direction to the second direction and perpendicular to the vertical direction, is 0.

18. The inspection device as claimed in claim 14, wherein, when the position of the MRAM element is altered to change from the third direction to the fourth direction in the second magnetic field, a magnetic field component in a second scan direction from the third direction to the fourth direction and the magnetic field component in the vertical direction is 0.

19. An inspection device comprising:
a stage having a stage surface and fixing a magnetoresistive random access memory (MRAM) element on the stage surface;
a first electromagnet, a second electromagnet, a third electromagnet and a fourth electromagnet each includes a yoke whose end faces a predetermined area and a coil wound around yoke in the same direction, wherein an end of a yoke of the first electromagnet and an end of a yoke of the second electromagnet are oppose in an one direction, an end of a yoke of the third electromagnet and an end of a yoke of the fourth electromagnet are oppose in a direction orthogonal to the one direction and the first to fourth electromagnetic generate a first magnetic field in the predetermined space by applying currents in opposite direction to coils of the first and the second electromagnet and not applying currents to coils of the third and the fourth electromagnet;
an optical system illuminating the MRAM element with illumination light including polarized light, and simultaneously condensing reflected light from which the illumination light is reflected from the MRAM element;
a detector detecting the reflected light when the position of the MRAM element in the first magnetic field is changed; and
an information processing unit performing an inspection a detect in the MRAM element by the magnetic field component in a vertical direction perpendicular to the stage surface based on images generated when the position of the MRAM element in the first magnetic field is changed.

20. The inspection device as claimed in claim 19, wherein the first to fourth electromagnetic generate a second magnetic field in the predetermined space by applying currents in one direction to coils of the first and the second electromagnet and applying currents in a direction opposite to the one direction to coils of the third and the fourth electromagnet,
the detector detects the reflected light when the position of the MRAM element in the second magnetic field is changed, and
the information processing unit performs an inspection of a defect in the MRAM element by the magnetic field component in an in-plane direction parallel to the stage surface, based on images generated when the position of the MRAM element in the second magnetic field is changed.

* * * * *